(12) United States Patent  
Takaku

(10) Patent No.: US 10,546,819 B2  
(45) Date of Patent: Jan. 28, 2020

(54) SEMICONDUCTOR DEVICE AND METHOD OF MANUFACTURING THE SAME

(71) Applicant: Toshiba Memory Corporation, Minato-ku, Tokyo (JP)

(72) Inventor: Satoru Takaku, Yokohama Kanagawa (JP)

(73) Assignee: TOSHIBA MEMORY CORPORATION, Tokyo (JP)

( * ) Notice: Subject to any disclaimer, the term of this patent is extended or adjusted under 35 U.S.C. 154(b) by 0 days.

(21) Appl. No.: 15/456,098

(22) Filed: Mar. 10, 2017

(65) Prior Publication Data

US 2018/0076146 A1 Mar. 15, 2018

Related U.S. Application Data

(60) Provisional application No. 62/395,359, filed on Sep. 15, 2016.

(51) Int. Cl.
*H01L 23/552* (2006.01)
*H01L 23/528* (2006.01)
*H01L 23/00* (2006.01)

(52) U.S. Cl.
CPC ........ *H01L 23/552* (2013.01); *H01L 23/5286* (2013.01); *H01L 24/48* (2013.01); *H01L 24/49* (2013.01); *H01L 2224/48106* (2013.01); *H01L 2224/48227* (2013.01); *H01L 2224/48245* (2013.01); *H01L 2224/4903* (2013.01); *H01L 2224/49052* (2013.01); *H01L 2224/49096* (2013.01); *H01L 2224/49175* (2013.01)

(58) Field of Classification Search
CPC .............. H01L 2225/06537; H01L 2924/3025
See application file for complete search history.

(56) References Cited

U.S. PATENT DOCUMENTS

| 8,497,156 B2 | 7/2013 | Moriya | |
| 2005/0274717 A1* | 12/2005 | Kataoka | H05B 6/1209 219/622 |
| 2008/0087987 A1* | 4/2008 | Wang | B81B 7/0064 257/659 |
| 2011/0294261 A1* | 12/2011 | Moriya | H01L 23/29 438/112 |
| 2011/0304993 A1* | 12/2011 | Takemura | H01L 23/3121 361/736 |
| 2014/0048913 A1* | 2/2014 | Park | H01L 23/552 257/659 |

FOREIGN PATENT DOCUMENTS

| JP | 3632960 B2 | 3/2005 |
| JP | 5248918 B2 | 7/2013 |

* cited by examiner

*Primary Examiner* — Jay C Chang  
*Assistant Examiner* — Mikka Liu  
(74) *Attorney, Agent, or Firm* — Holtz, Holtz & Volek PC

(57) ABSTRACT

In one embodiment, a semiconductor device includes a substrate, and a first shield member provided on or in the substrate. The device further includes a semiconductor chip provided on the first shield member, and a first wire electrically connected to the semiconductor chip and the substrate. The device further includes a second wire electrically or magnetically connected to the first shield member, and a second shield member provided above the semiconductor chip, electrically insulated from the first wire, and electrically or magnetically connected to the second wire.

17 Claims, 23 Drawing Sheets

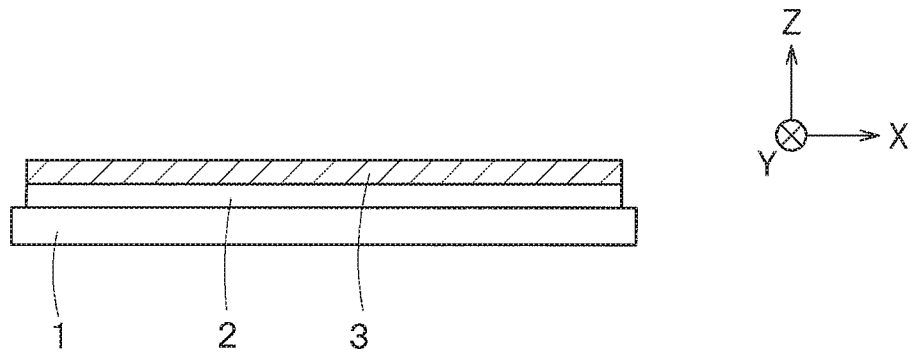
F I G. 1A
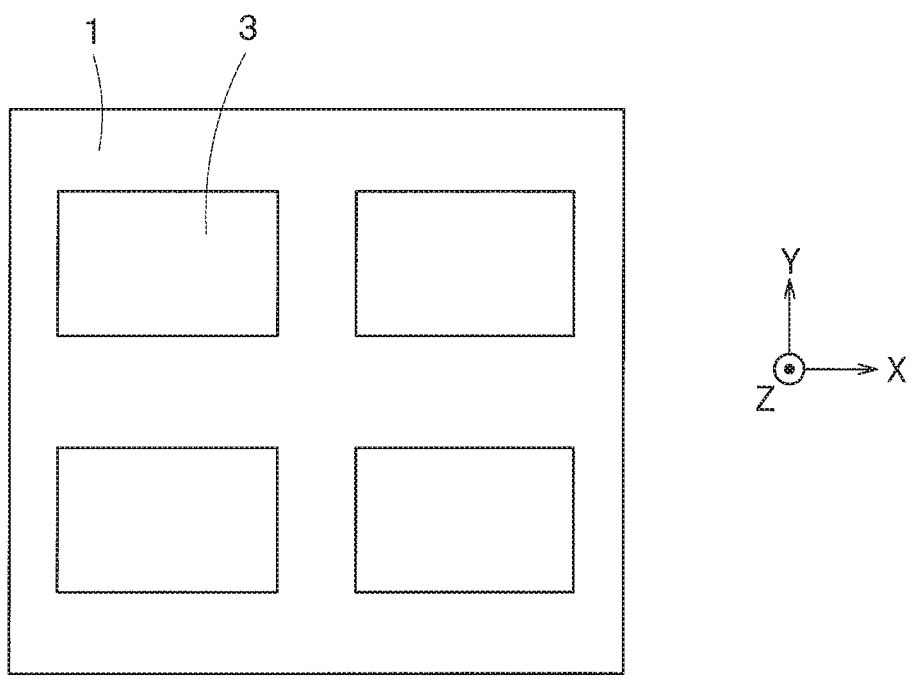
F I G. 1B

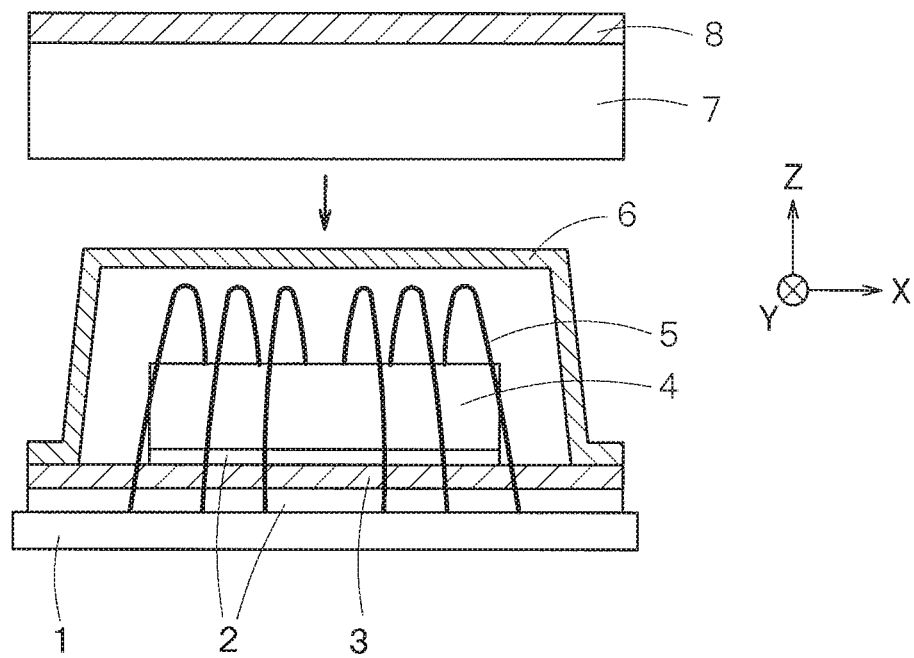
F I G. 4A
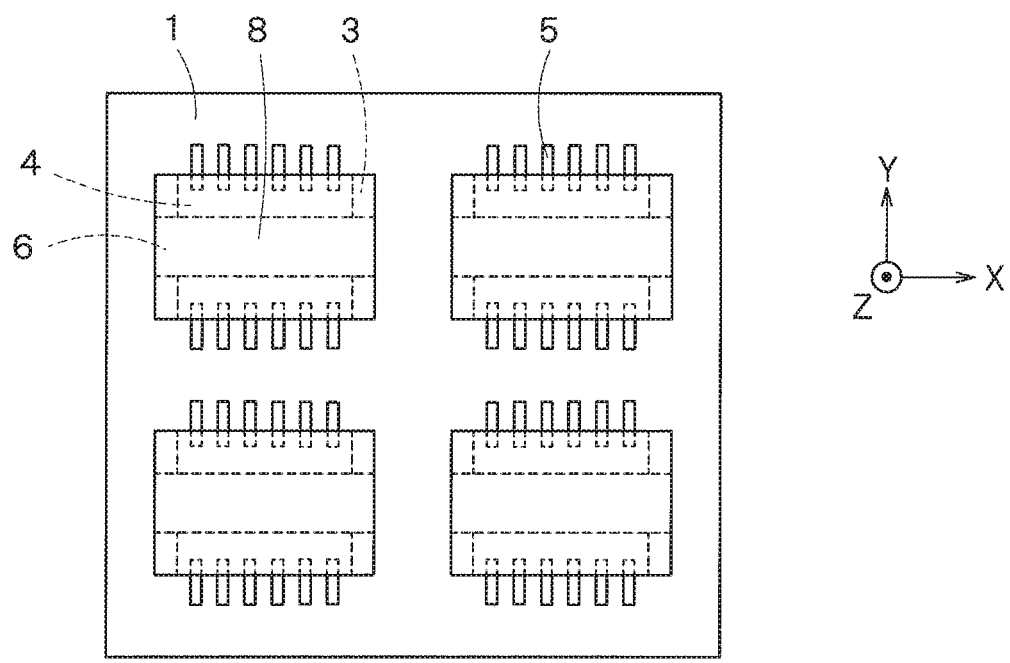
F I G. 4B

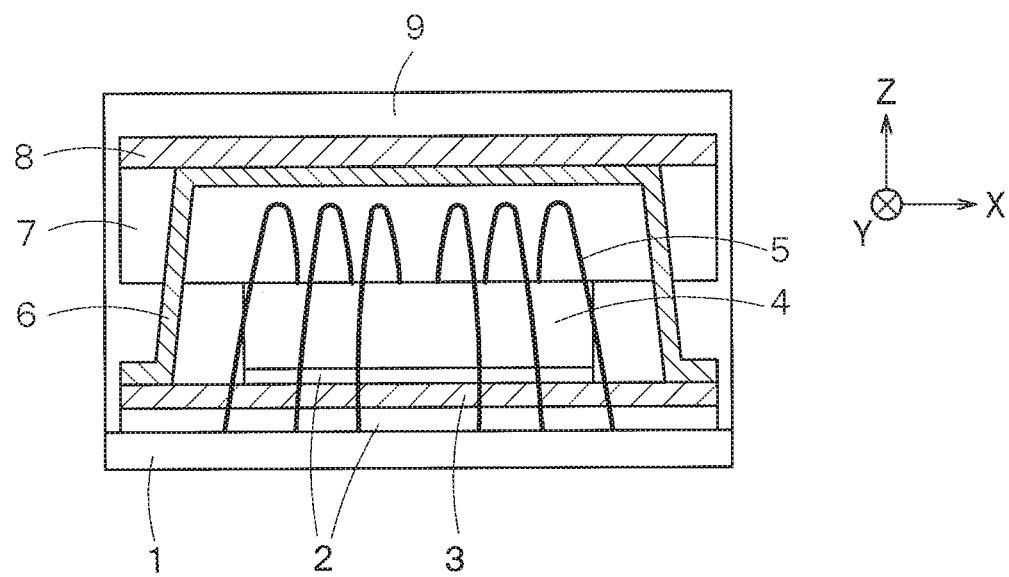
F I G. 5A
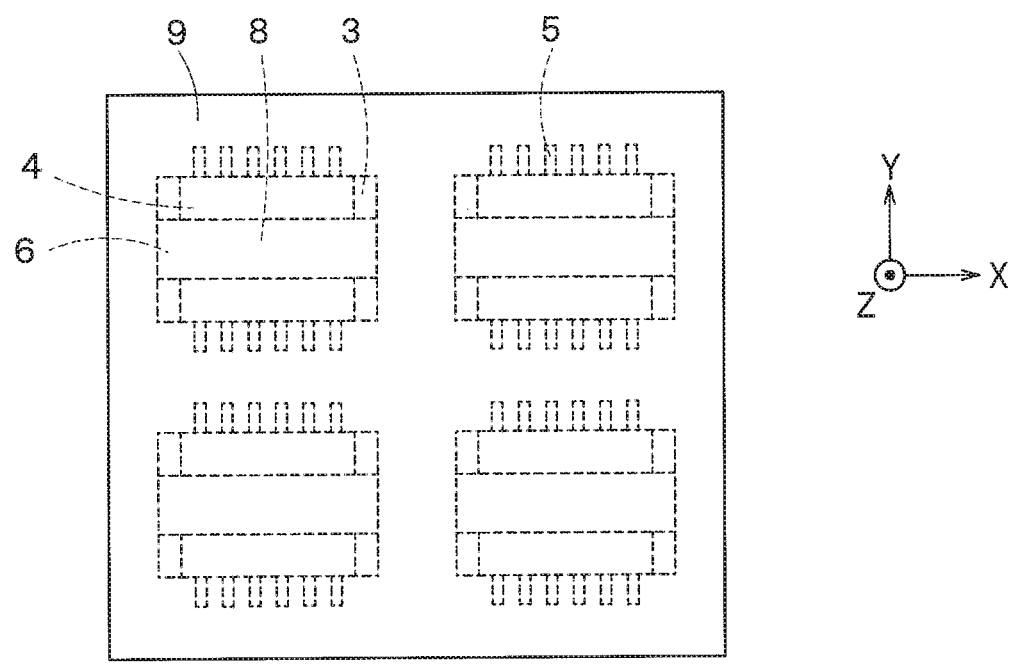
F I G. 5B

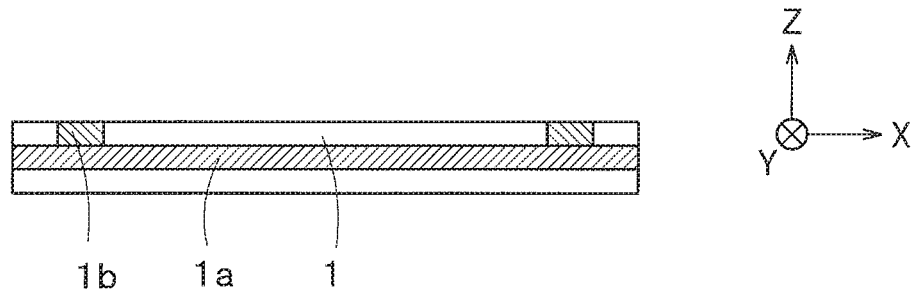
F I G. 7A
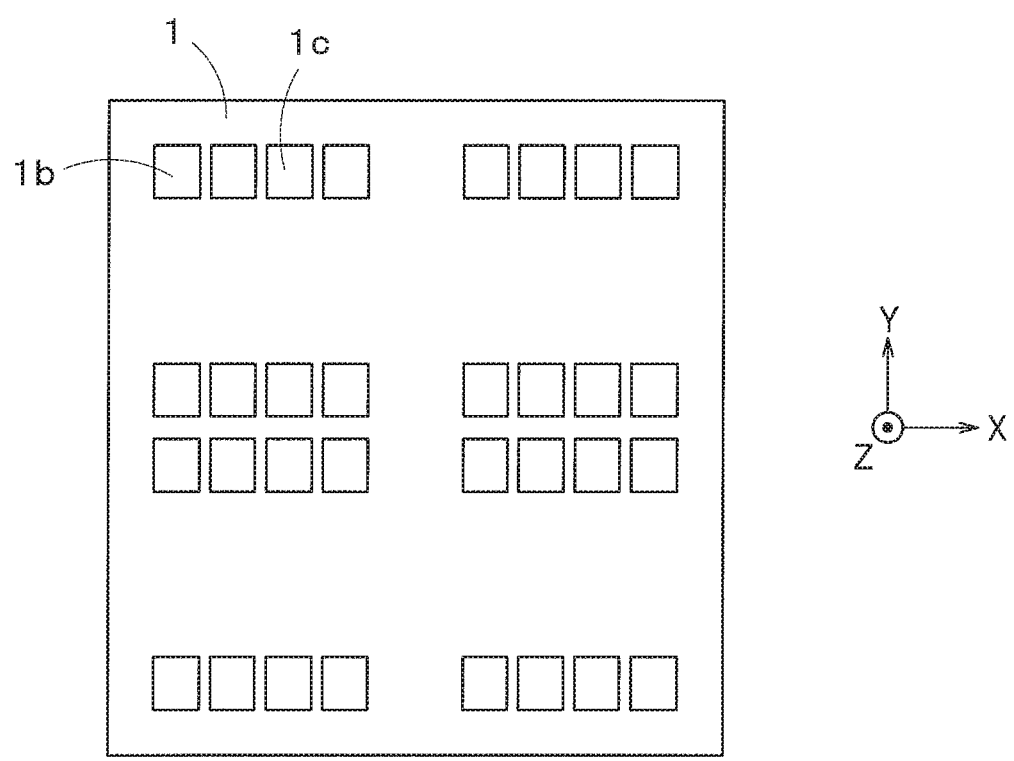
F I G. 7B

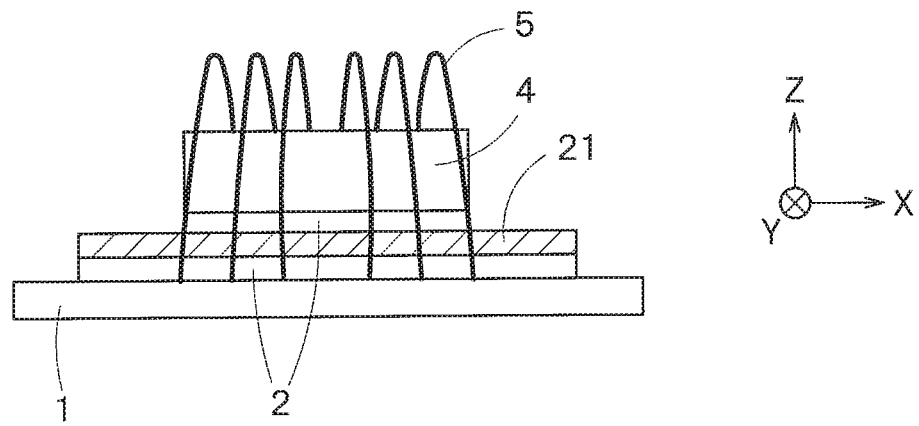
F I G. 13A
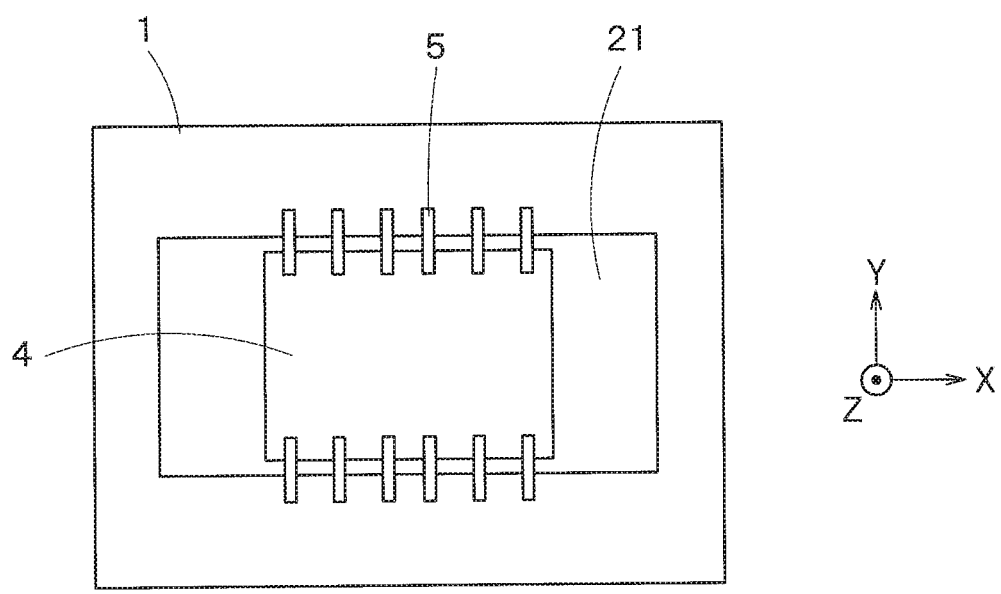
F I G. 13B

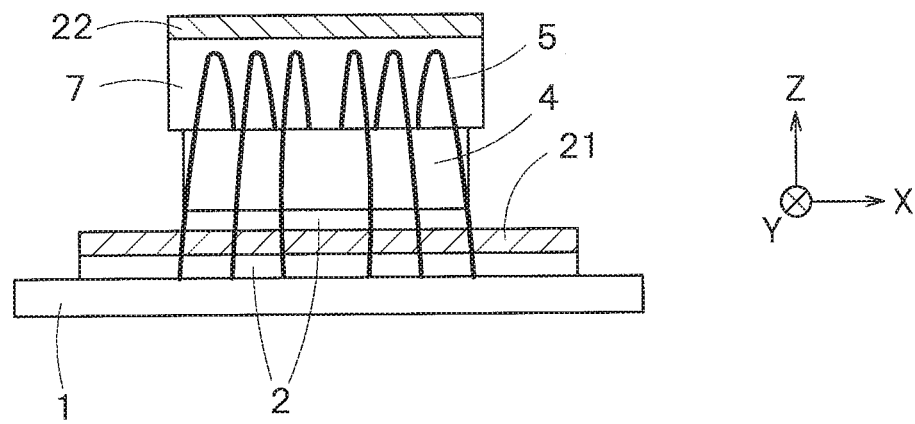
F I G. 14A
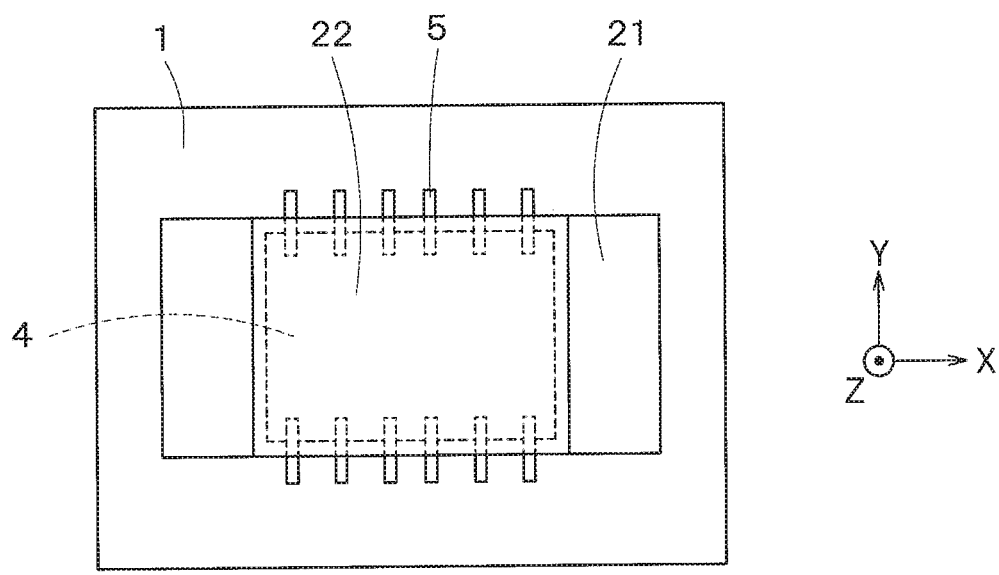
F I G. 14B

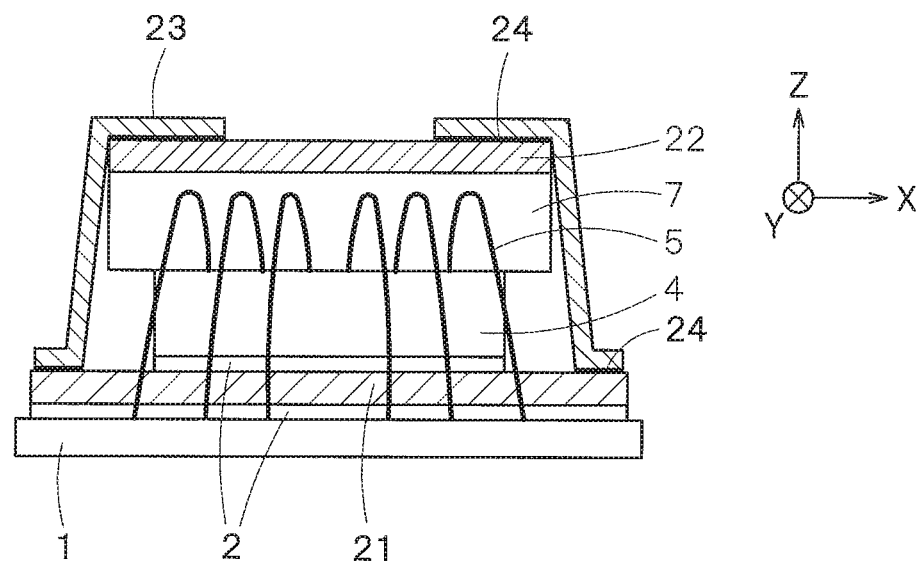
F I G. 15A
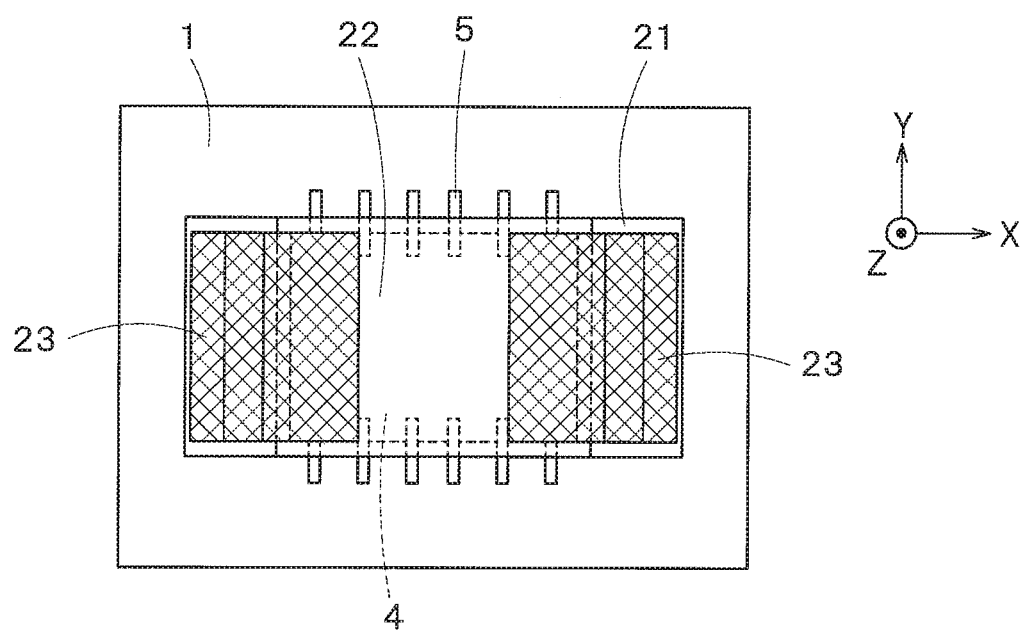
F I G. 15B

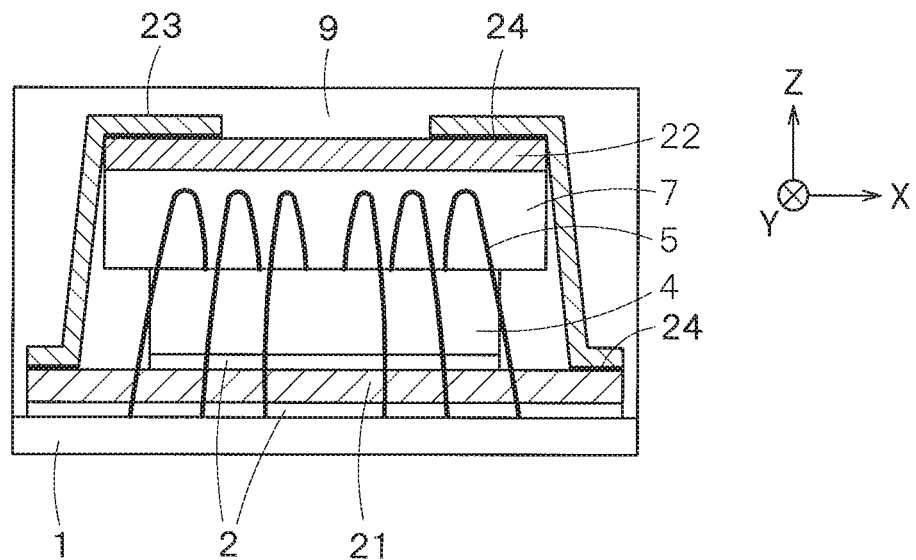
F I G. 16A
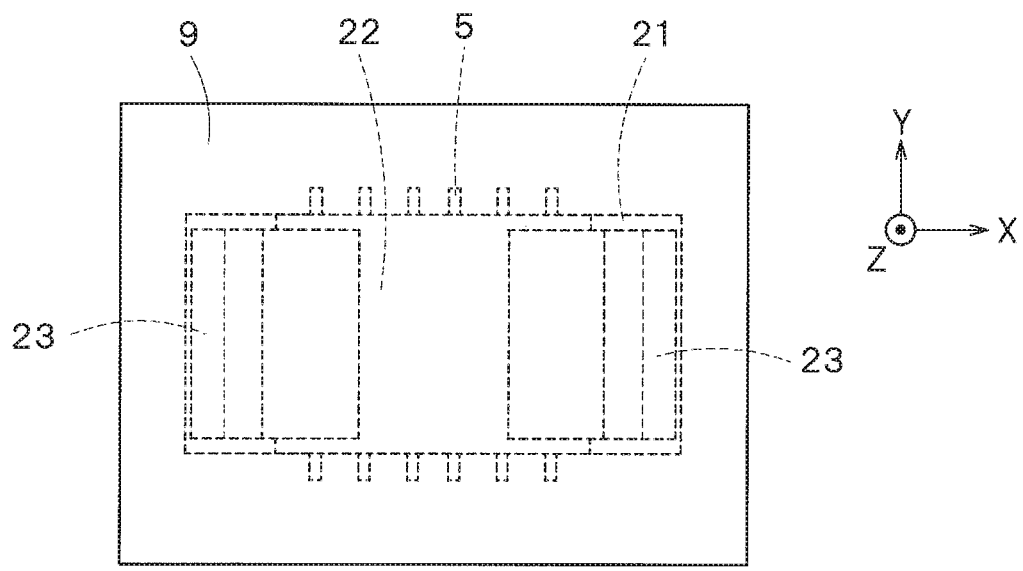
F I G. 16B

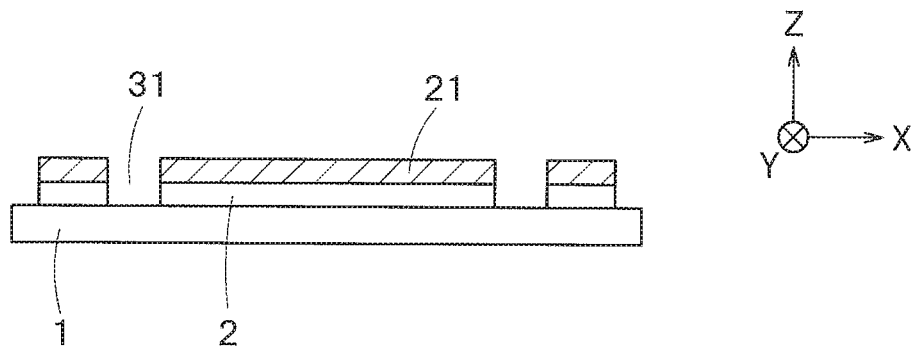
F I G. 17A
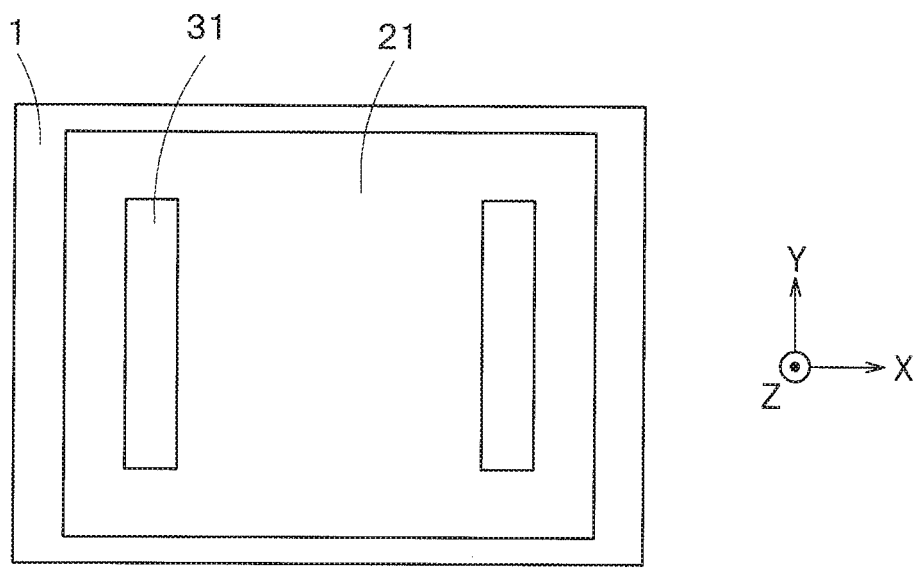
F I G. 17B

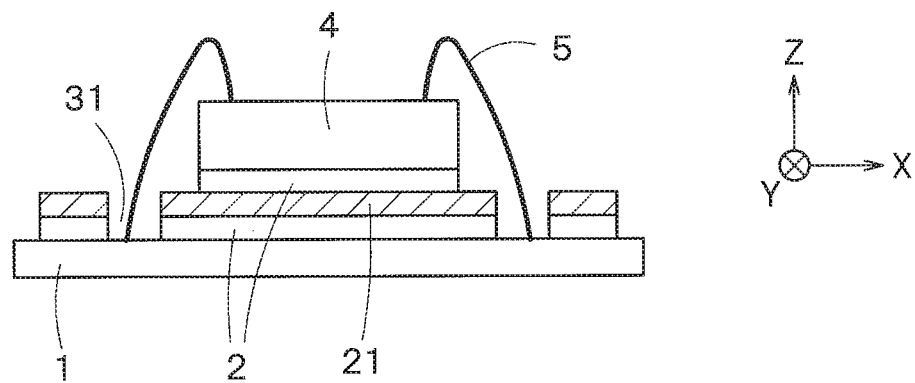
F I G. 18A
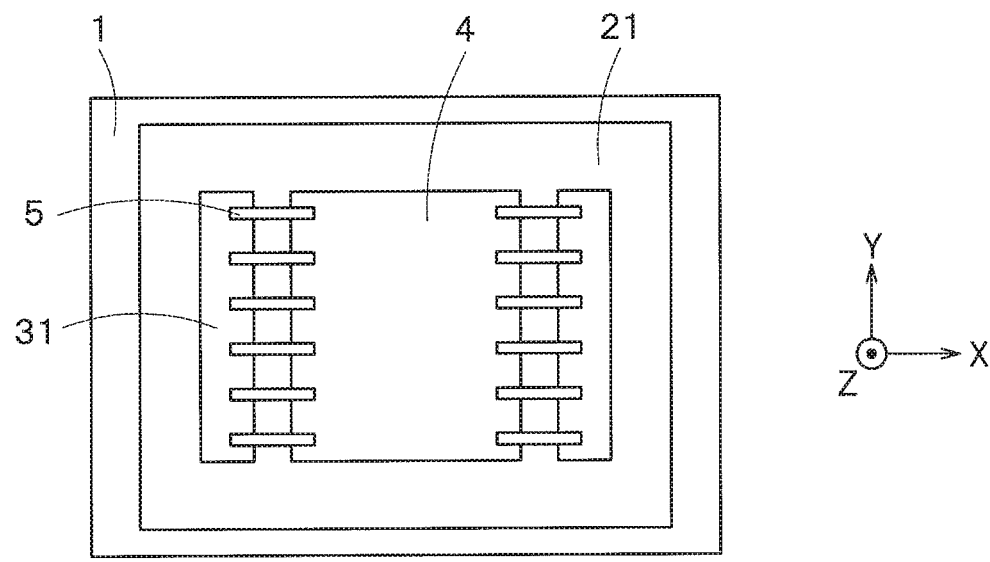
F I G. 18B

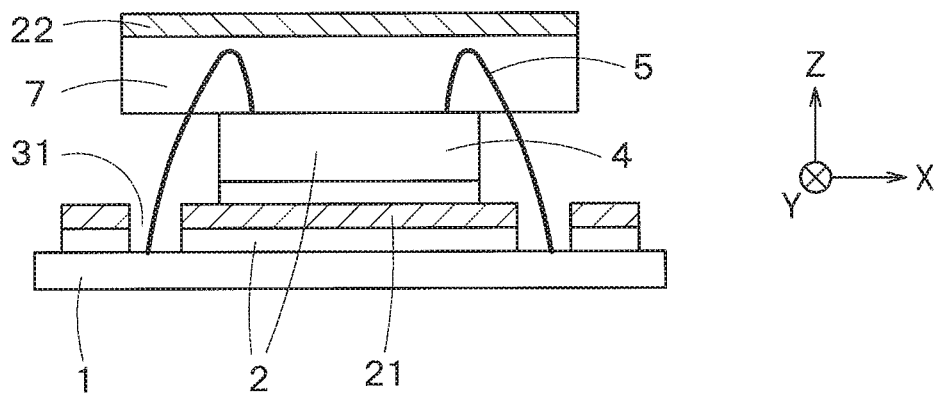
F I G. 19A
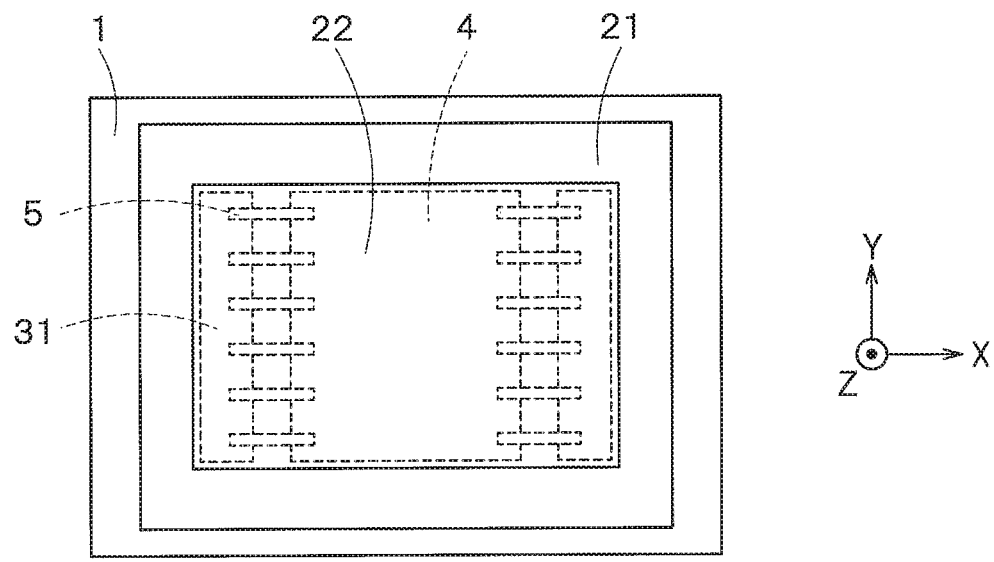
F I G. 19B

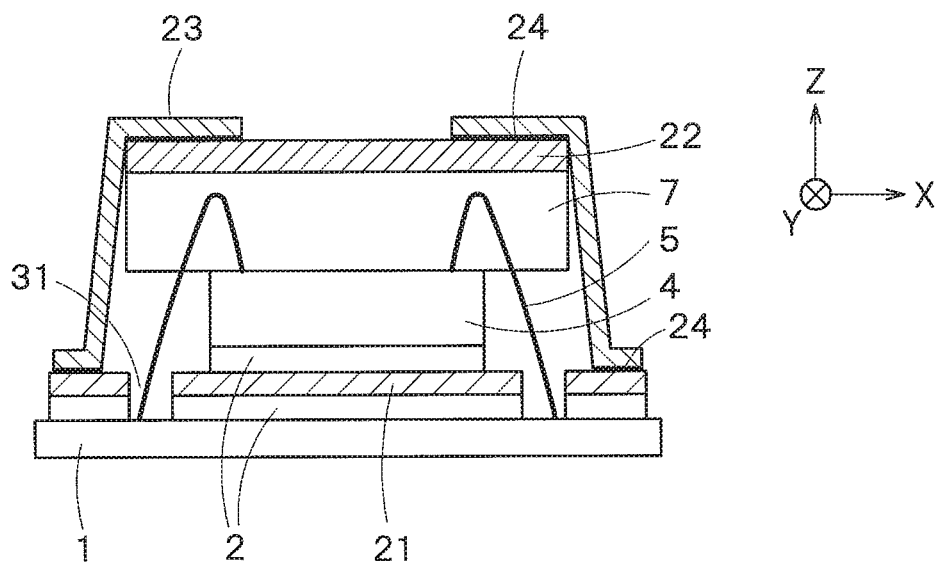
F I G. 20A
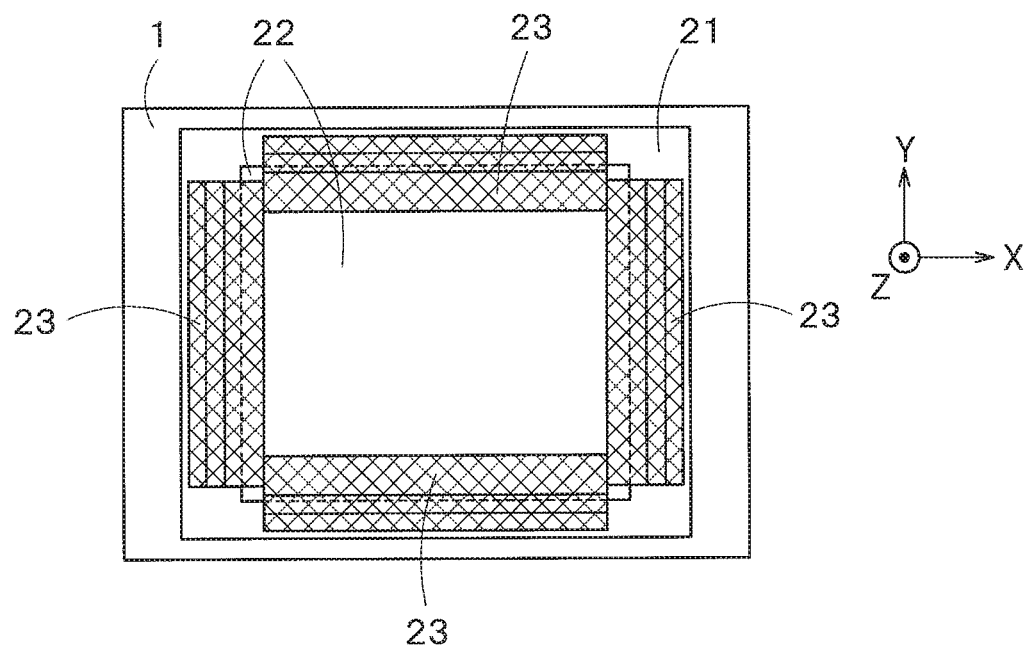
F I G. 20B

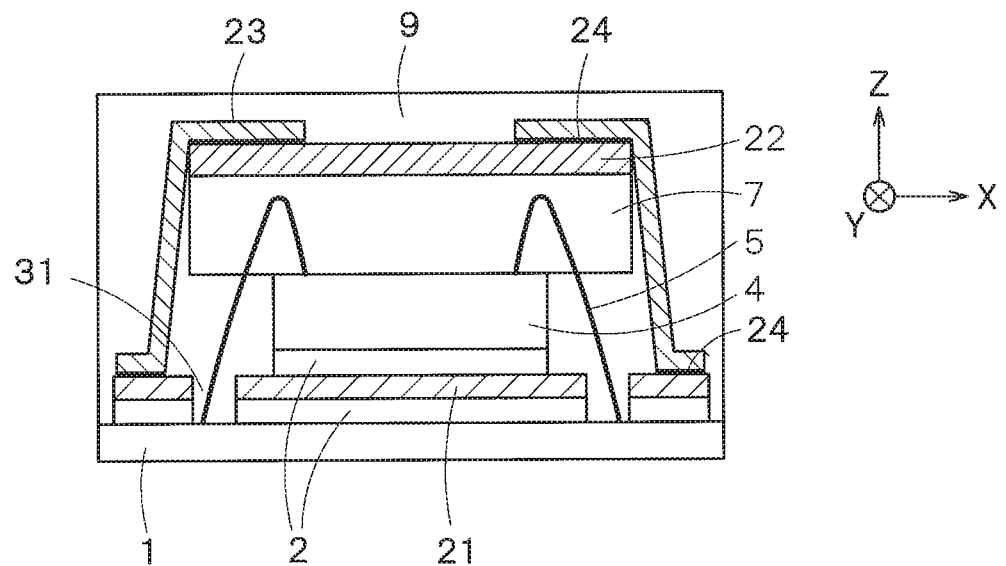
F I G. 21A
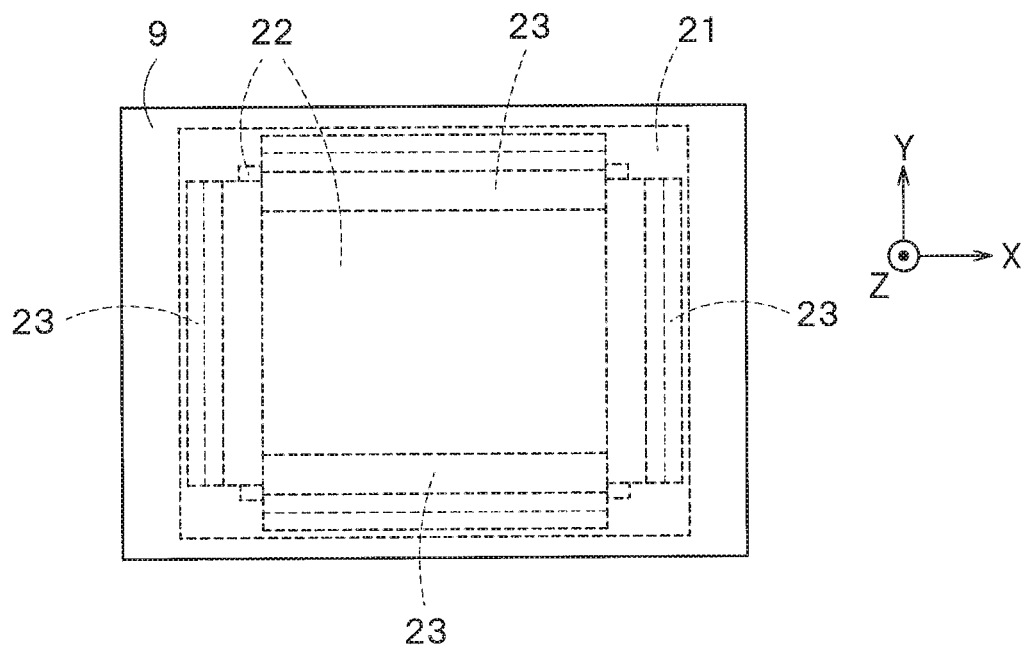
F I G. 21B

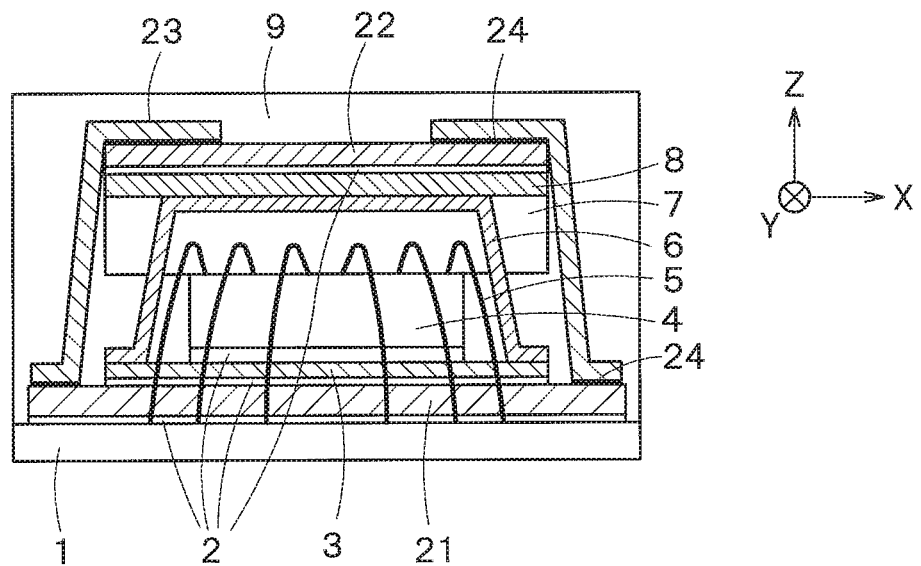
F I G. 22A
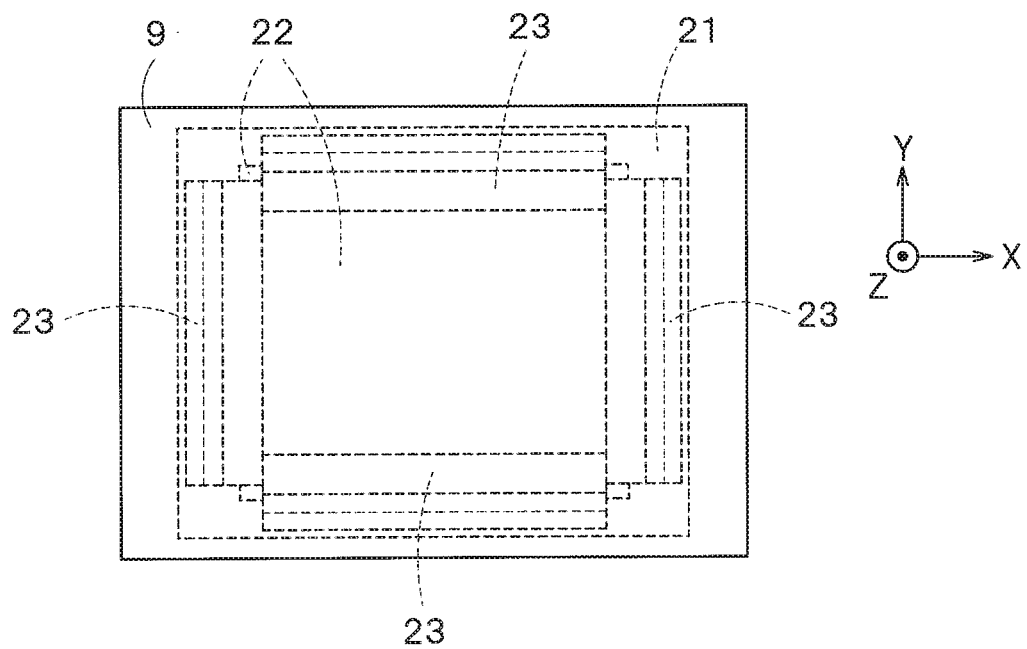
F I G. 22B

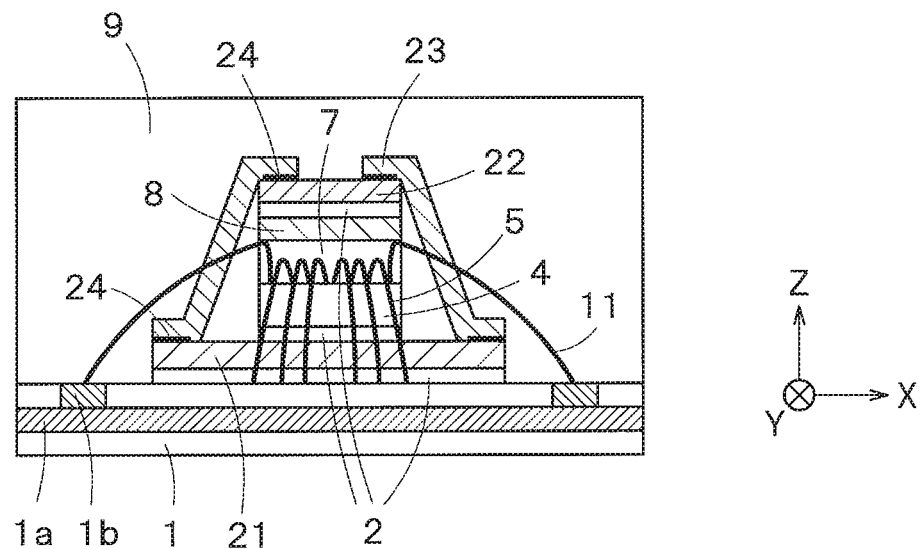
F I G. 23A
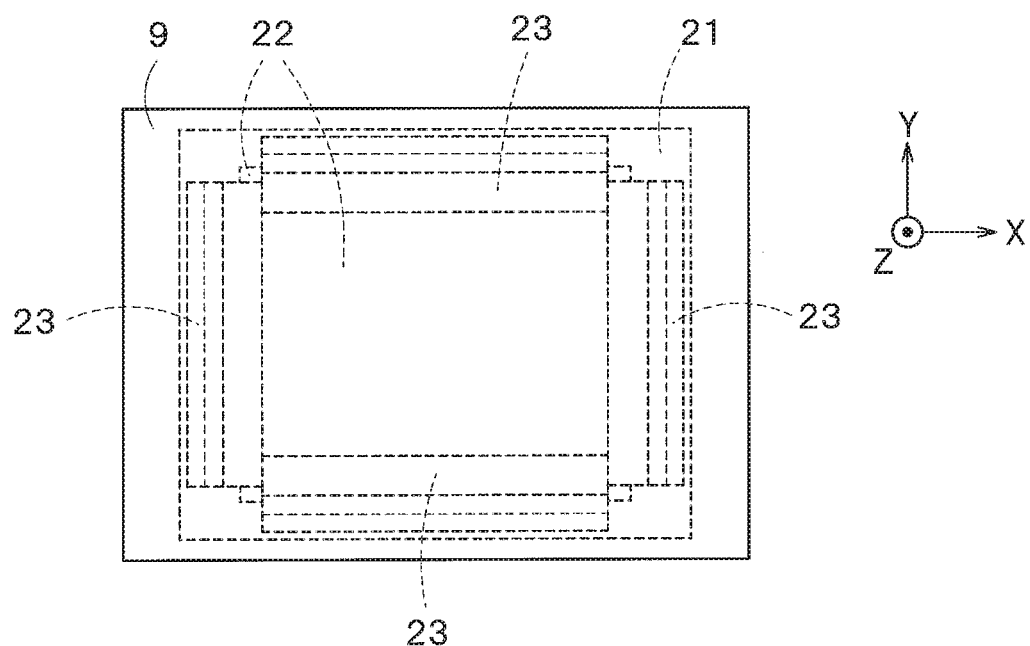
F I G. 23B

US 10,546,819 B2

SEMICONDUCTOR DEVICE AND METHOD OF MANUFACTURING THE SAME

CROSS REFERENCE TO RELATED APPLICATION

This application is based upon and claims the benefit of priority from the prior U.S. Provisional Patent Application No. 62/395,359 filed on Sep. 15, 2016, the entire contents of which are incorporated herein by reference.

FIELD

Embodiments described herein relate to a semiconductor device and a method of manufacturing the same.

BACKGROUND

A semiconductor chip that may be influenced by a magnetic field need be protected from magnetic noise incoming from the outside of the semiconductor chip. Accordingly, a magnetic material having high magnetic permeability is generally arranged near the semiconductor chip so as to let the magnetic field escape through the magnetic material. For example, it is possible to let the magnetic field escape by covering the surrounding of the semiconductor chip with a box-shaped magnetic member. However, in order to cover the surrounding of the semiconductor chip with the box-shaped magnetic member, it is necessary to sandwich the semiconductor chip between a holding plate made of a magnetic material and a lid plate made of a magnetic material and to bond the holding plate and the lid plate to each other by using an adhesive agent containing a magnetic material. As a result, there are problems that the magnetic permeability of the magnetic member is lowered by the adhesive agent and a step for applying the adhesive agent is required.

Furthermore, when a semiconductor chip generates an electromagnetic wave or may be influenced by an electromagnetic wave, it is necessary to prevent electromagnetic noise from being released from the semiconductor chip to the outside and to prevent electromagnetic noise from entering the semiconductor chip from the outside. For example, the surface of a semiconductor package is generally coated with a shield layer having high electrical conductivity and the shield layer is connected to a ground layer provided in a substrate so that the electromagnetic wave is reflected on the shield layer and escapes into the ground layer. This is called shield packaging. However, when the semiconductor package is coated by the shield layer, there are problems that the semiconductor manufacturing apparatus may be contaminated, the shielding effect may be lowered when the shield layer comes off, and it is difficult to engrave a laser mark on the shield layer.

BRIEF DESCRIPTION OF THE DRAWINGS

FIGS. 1A to 5B are cross-sectional views and top views illustrating a method of manufacturing a semiconductor device of a first embodiment;

FIGS. 7A to 10B are cross-sectional views and top views illustrating a method of manufacturing a semiconductor device of a second embodiment;

FIGS. 12A to 16B are cross-sectional views and top views illustrating a method of manufacturing a semiconductor device of a third embodiment;

FIGS. 17A to 21B are cross-sectional views and top views illustrating a method of manufacturing a semiconductor device of a fourth embodiment;

FIGS. 22A and 22B are a cross-sectional view and a top view illustrating a structure of a semiconductor device of a fifth embodiment; and FIGS. 23A and 23B are a cross-sectional view and a top view illustrating a structure of a semiconductor device of a sixth embodiment.

DETAILED DESCRIPTION

Figure 2A:
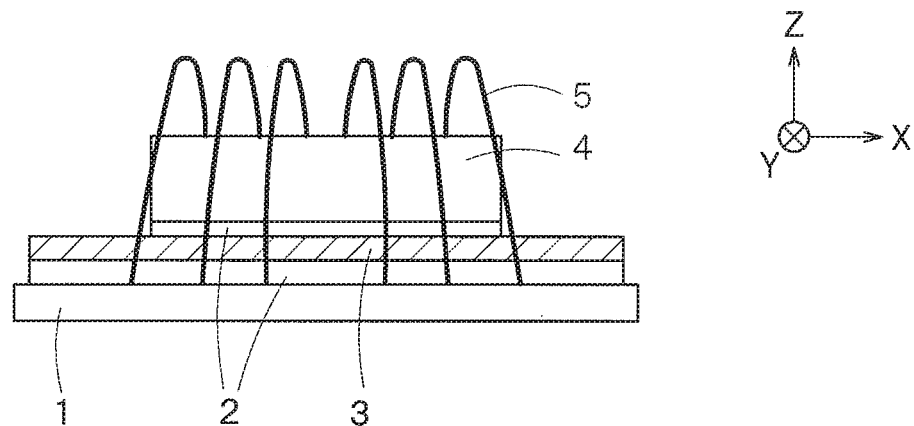

Embodiments will now be explained with reference to the accompanying drawings. In FIGS. 1A to 23B, the same or similar configurations are denoted by the same reference numerals and the duplicated description thereof will be omitted.

In one embodiment, a semiconductor device includes a substrate, and a first shield member provided on or in the substrate. The device further includes a semiconductor chip provided on the first shield member, and a first wire electrically connected to the semiconductor chip and the substrate. The device further includes a second wire electrically or magnetically connected to the first shield member, and a second shield member provided above the semiconductor chip, electrically insulated from the first wire, and electrically or magnetically connected to the second wire.

First Embodiment

FIGS. 1A to 5B are cross-sectional views and top views illustrating a method of manufacturing a semiconductor device of a first embodiment. For example, the method of the present embodiment is applied to a case where a semiconductor chip need be protected from magnetic noise caused by a static magnetic field.

FIG. 1A is a cross-sectional view illustrating the method of manufacturing the semiconductor device of the present embodiment, and FIG. 1B is a top view corresponding to FIG. 1A. FIGS. 1A and 1B illustrate an X-direction and a Y-direction that are parallel to the surface of a substrate 1 and are perpendicular to each other, and a Z-direction that is perpendicular to the surface of the substrate 1. In the present specification, the +Z direction is assumed to be the upward direction whereas the −Z direction is assumed to be the downward direction. However, the −Z direction may or may not coincide with the direction of the gravity. The explanation above also applies to FIGS. 2A to 5B and other drawings explained below.

First, shield lower plates 3 are mounted on the substrate 1 via die attachment (DA) materials 2 (FIGS. 1A and 1B). The shield lower plates 3 are formed, for example, of a magnetic material having high magnetic permeability such as iron or permalloy (an iron-nickel alloy). The shield lower plates 3 are an example of a first shield member.

FIG. 1A illustrates a shield lower plate 3 on which a semiconductor chip is to be mounted. FIG. 1B illustrates four shield lower plates 3 on which four semiconductor chips are to be mounted. FIG. 1A is a cross-sectional view of any one of the four shield lower plates 3 illustrated in FIG.

1B. In the following description, manufacturing steps performed on each shield lower plate 3 will be explained.

Figure 2B:
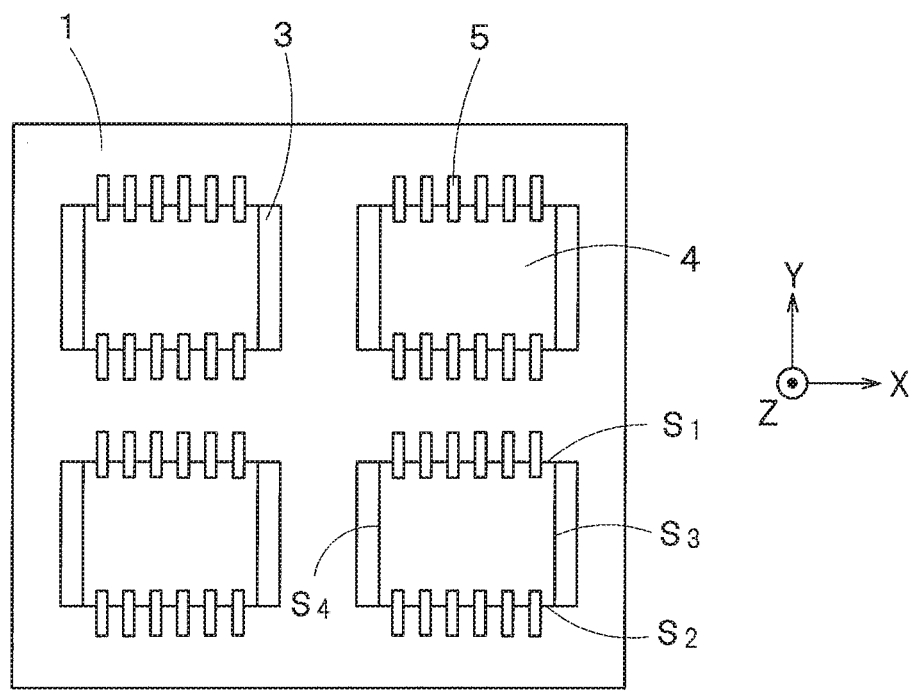

Next, the semiconductor chips 4 are mounted on the shield lower plates 3 via the DA materials 2, and the substrate 1 is electrically connected to the semiconductor chips 4 by bonding wires 5 (FIGS. 2A and 2B). The bonding wires 5 are wires for signals or power supplies, and electrically connect the pads on the surface of the substrate 1 and the pads on the surface of the semiconductor chips 4. The bonding wires 5 are an example of a first wire.

Each semiconductor chip 4 illustrated in FIG. 2B has a first lateral face $S_1$, a second lateral face $S_2$ positioned opposite the first lateral face $S_1$, a third lateral face $S_3$ positioned between the first lateral face $S_1$ and the second lateral face $S_2$, and a fourth lateral face $S_4$ positioned opposite the third lateral face $S_3$. The first lateral face $S_1$, the second lateral face $S_2$, the third lateral face $S_3$ and the fourth lateral face $S_4$ of the present embodiment face the +Y direction, the −Y direction, the +X direction and the −X direction, respectively. The bonding wires 5 are electrically connected to the substrate 1 and to the semiconductor chips 4 in the vicinity of the first and the second lateral faces $S_1$ and $S_2$.

Figure 3A:
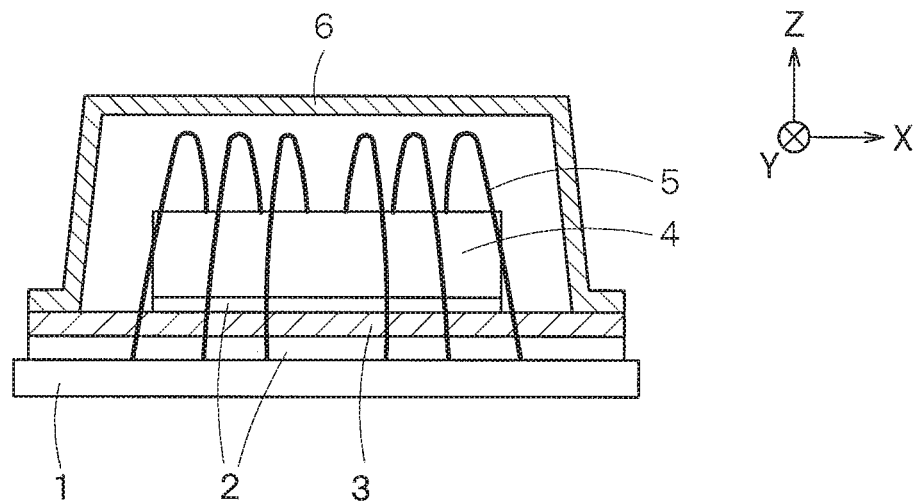
Figure 3B:
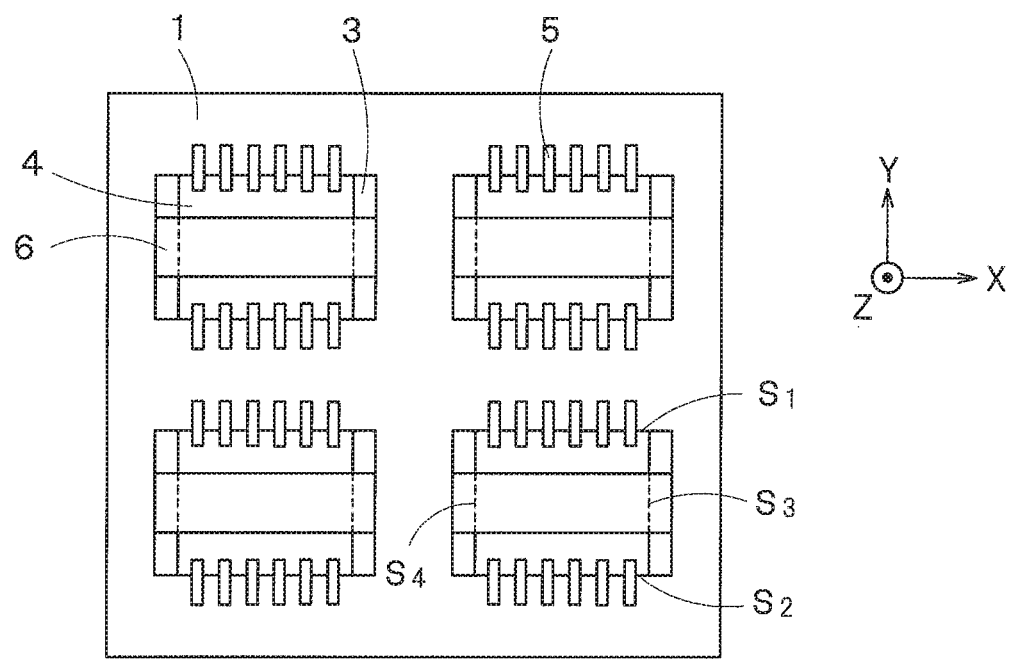

Next, two ends of each shielding wire 6 are magnetically connected to a shield lower plate 3 (FIGS. 3A and 3B). More specifically, each shielding wire 6 is extended across a semiconductor chip 4 so as to be positioned above the semiconductor chip 4. One end of each shielding wire 6 is magnetically connected to a shield lower plate 3 in the vicinity of the third lateral face $S_3$, and the other end of each shielding wire 6 is magnetically connected to the shield lower plate 3 in the vicinity of the fourth lateral face $S_4$. The shielding wires 6 are an example of a second wire.

As explained above, each bonding wire 5 of the present embodiment is electrically connected to the substrate 1 and a semiconductor chip 4 on the side of the first or second lateral face $S_1$ or $S_2$, and each shielding wire 6 of the present embodiment is magnetically connected to a shield lower plate 3 on the side of the third or fourth lateral face $S_3$ or $S_4$.

The shielding wires 6 are formed, for example, of a magnetic material having high magnetic permeability such as iron or permalloy. Each shielding wire 6 of the present embodiment is a ribbon wire having a belt-like shape. Furthermore, the shielding wires 6 of the present embodiment are magnetically connected to the shield lower plates 3 through a pressure bonding process without using any adhesive agent. An example of the pressure bonding process is an ultrasonic pressure bonding process. Because bending the shielding wires 6 makes it easier to perform the pressure bonding process thereon, it is desirable to configure the shielding wires 6 with a material that is easily bent.

As illustrated in FIG. 3A, the height of the highest portion of each shielding wire 6 of the present embodiment is arranged to be higher than the height of the highest portion of each bonding wire 5. This arrangement is adopted to bring shield upper plates 8 (explained later) into contact with the shielding wires 6 and to keep the shield upper plates 8 out of contact with the bonding wires 5. Furthermore, the shielding wires 6 of the present embodiment are positioned so as to be out of contact with the bonding wires 5 and are electrically and magnetically insulated from the bonding wires 5.

Next, the shield upper plates 8 are mounted above the semiconductor chips 4 via embedding DA materials 7 (FIGS. 4A and 4B). Furthermore, the shield upper plates 8 are magnetically connected to the shielding wires 6 (FIGS. 5A and 5B). More specifically, the shield upper plates 8 are magnetically connected to the shielding wires 6 by being brought into contact with the shielding wires 6. Also, the shield upper plates 8 are electrically and magnetically insulated from the bonding wires 5 by being kept out of contact with the bonding wires 5. Each embedding DA material 7 is a film called "film on wire (FOW)", for example. The shield upper plates 8 are formed, for example, of a magnetic material having high magnetic permeability such as iron or permalloy. The shield upper plates 8 are an example of a second shield member.

In the present embodiment, the shield lower plates 3 are magnetically connected to the shield upper plates 8 by the shielding wires 6. Accordingly, each set of a shield lower plate 3, a shielding wire 6 and a shield upper plate 8 can effectively protect a semiconductor chip 4 from magnetic noise by functioning as a single magnetic material. It is desirable to form the shield lower plates 3, the shielding wires 6 and the shield upper plates 8 by using one or more types of magnetic materials having the same or similar levels of magnetic permeability. With this arrangement, it is possible to prevent an N pole and an S pole generating a large magnetic field from being generated in the magnetic material made of a shield lower plate 3, a shielding wire 6 and a shield upper plate 8.

As illustrated in FIG. 4A, the shield upper plates 8 are mounted above the semiconductor chips 4 via the embedding DA materials 7 pasted on the lower faces of the shield upper plates 8. With this arrangement, as illustrated in FIG. 5A, portions of the bonding wires 5 and the shielding wires 6 are embedded by the embedding DA materials 7, and the positions of the shield upper plates 8 are fixed with respect to the shielding wires 6. After that, the semiconductor chips 4 and the like are sealed by sealing resin 9 in the present embodiment (FIGS. 5A and 5B).

Figure 6:
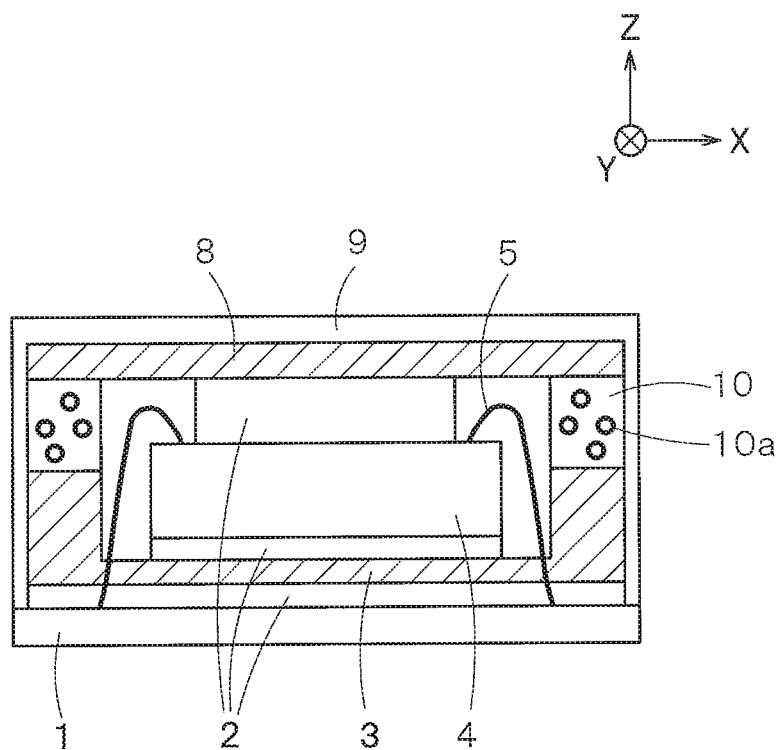
FIG. 6 is a cross-sectional view illustrating a structure of a semiconductor device of a comparative example of the first embodiment.

FIG. 6 is a cross-sectional view illustrating a structure of a semiconductor device of a comparative example of the first embodiment.

The shield lower plate 3 and the shield upper plate 8 in this comparative example serve as a holding plate and a lid plate, respectively. The shield lower plate 3 and the shield upper plate 8 are adhered to each other by an adhesive agent 10 containing a magnetic material 10a having high magnetic permeability. In this situation, because the adhesive agent 10 contains resin besides the magnetic material 10a, the magnetic permeability of the adhesive agent 10 is lower than the magnetic permeability of the magnetic material 10a itself. As a result, the shielding effect of the shield lower plate 3 and the shield upper plate 8 against magnetic noise is lowered. In contrast, the present embodiment makes it possible to solve this problem by avoiding the use of the adhesive agent 10.

As explained above, the shield lower plates 3 and the shield upper plates 8 of the present embodiment are magnetically connected by the corresponding shielding wires 6. Consequently, the present embodiment makes it possible to realize a shield structure by using the shield lower plates 3, the shielding wires 6 and the shield upper plates 8, and to protect the semiconductor chips 4 from magnetic noise by using the shield structure having a high shielding effect. Also, the present embodiment makes it possible, by avoiding the use of the adhesive agent 10 is avoided, to avoid the material cost of the adhesive agent 10 and burdens from the adhering step, which can shorten "turn around time (TAT)" in the manufacture of the semiconductor device.

Second Embodiment

FIGS. 7A to 10B are cross-sectional views and top views illustrating a method of manufacturing a semiconductor device of a second embodiment. For example, the method of the present embodiment is applied to a case where a semiconductor chip generates an electromagnetic wave or may be influenced by an electromagnetic wave.

First, the substrate 1 illustrated in FIGS. 7A and 7B is prepared. The substrate 1 includes a ground layer 1a for shielding, pads 1b for shielding and other pads 1c. The ground layer 1a is formed in the substrate 1. The pads 1b are electrically connected to the ground layer 1a and are exposed to the surface of the substrate 1. The pads 1c are electrically insulated from the ground layer 1a and are exposed to the surface of the substrate 1. For the sake of convenience in illustration, only FIG. 7B illustrates the pads 1c and FIG. 7A does not illustrate the pads 1c. The ground layer 1a and the pads 1b and 1c are formed, for example, of a conductive material having high electrical conductivity such as copper or 42 alloy (an iron-nickel alloy). The ground layer 1a and the former pads 1b are an example of a first shield member.

Figure 8A:
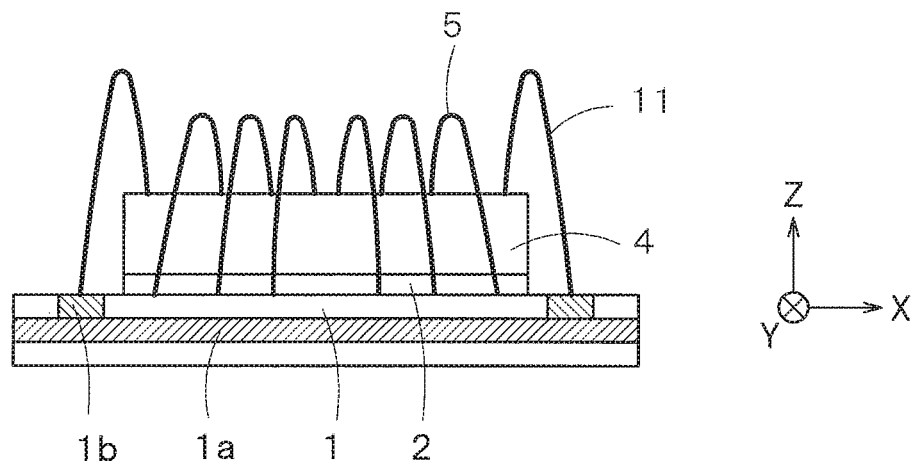
Figure 8B:
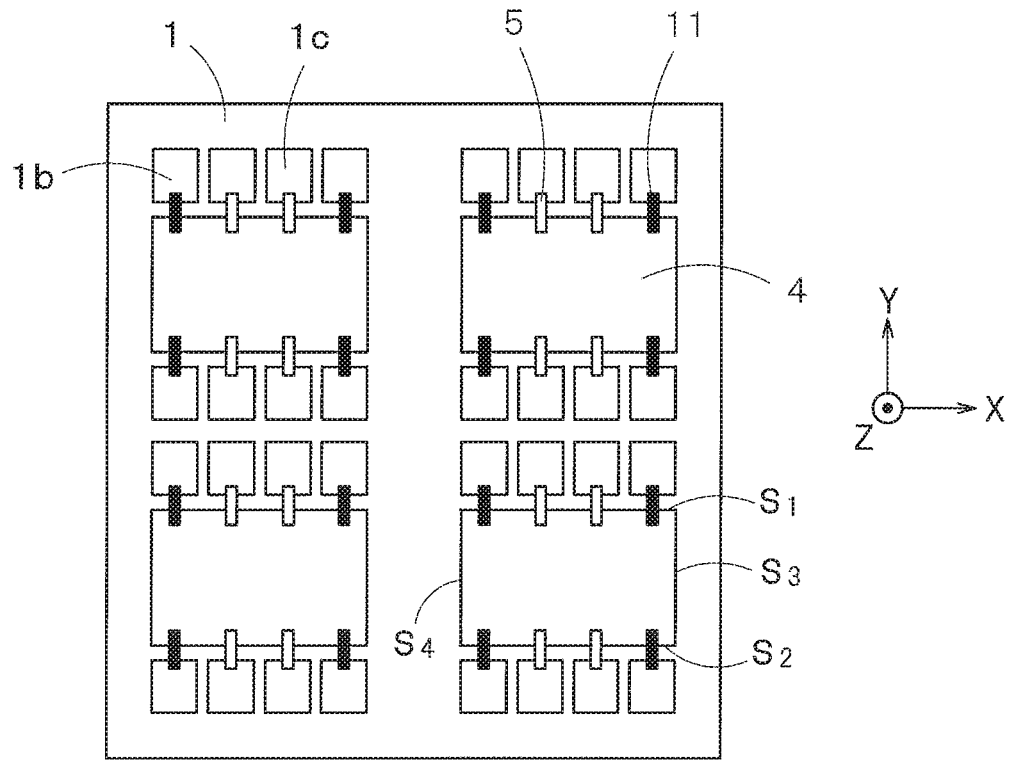

Next, the semiconductor chips 4 are mounted on the substrate 1 via the DA materials 2, and the substrate 1 is electrically connected to the semiconductor chips 4 by the bonding wires 5 and shielding wires 11 (FIGS. 8A and 8B). The bonding wires 5 are wires for signals and power supplies, and are electrically connected to the pads 1c on the surface of the substrate 1 and the pads on the surface of the semiconductor chips 4. Each shielding wire 11 has a linear shape similarly to the bonding wires 5, and is electrically connected to a pad 1b on the surface of the substrate 1 and a pad on the surface of a semiconductor chip 4. The shielding wires 11 are formed, for example, of a conductive material having high electrical conductivity such as copper or 42 alloy. The bonding wires 5 are an example of a first wire, and the shielding wires 11 are an example of a second wire.

Each semiconductor chip 4 illustrated in FIG. 8B has the first lateral face $S_1$, the second lateral face $S_2$ positioned opposite the first lateral face $S_1$, the third lateral face $S_3$ positioned between the first lateral face $S_1$ and the second lateral face $S_2$, and the fourth lateral face $S_4$ positioned opposite the third lateral face $S_3$. The bonding wires 5 are electrically connected to the substrate 1 and to the semiconductor chips 4 in the vicinity of the first and the second lateral faces $S_1$ and $S_2$. Similarly, the shielding wires 11 are electrically connected to the substrate 1 and to the semiconductor chips 4 in the vicinity of the first and the second lateral faces $S_1$ and $S_2$. As explained herein, each of the bonding wires 5 and the shielding wires 11 of the present embodiment is electrically connected to the substrate 1 and a semiconductor chip 4 on the side of the first or second lateral face $S_1$ or $S_2$.

As illustrated in FIG. 8A, the height of the highest portion of each shielding wire 11 of the present embodiment is arranged to be higher than the height of the highest portion of each bonding wire 5. This arrangement is adopted to bring the shield upper plates 8 into contact with the shielding wires 11 and to keep the shield upper plates 8 out of contact with the bonding wires 5. Furthermore, the shielding wires 11 of the present embodiment are positioned so as to be out of contact with the bonding wires 5, and are electrically insulated from the bonding wires 5.

Figure 9A:
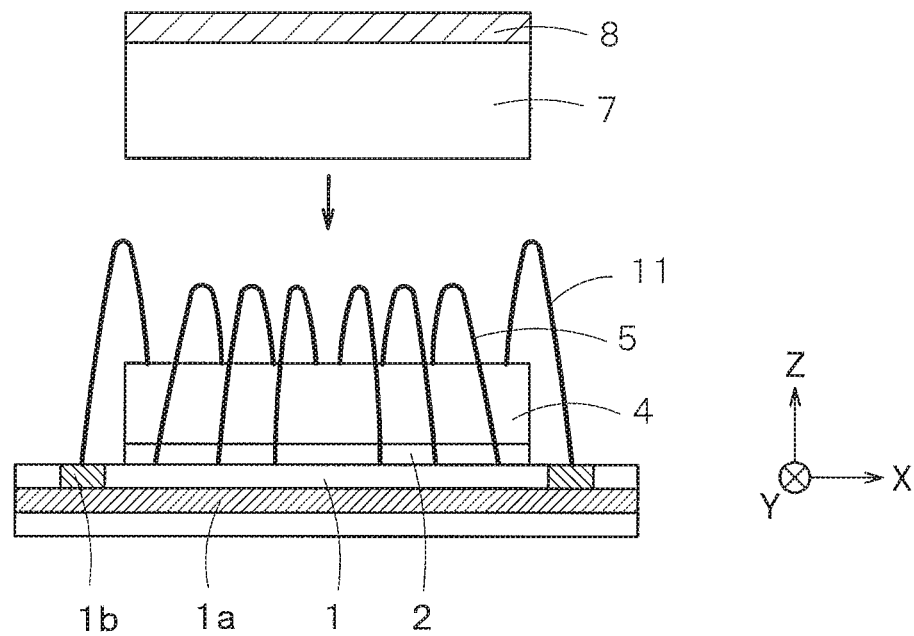
Figure 9B:
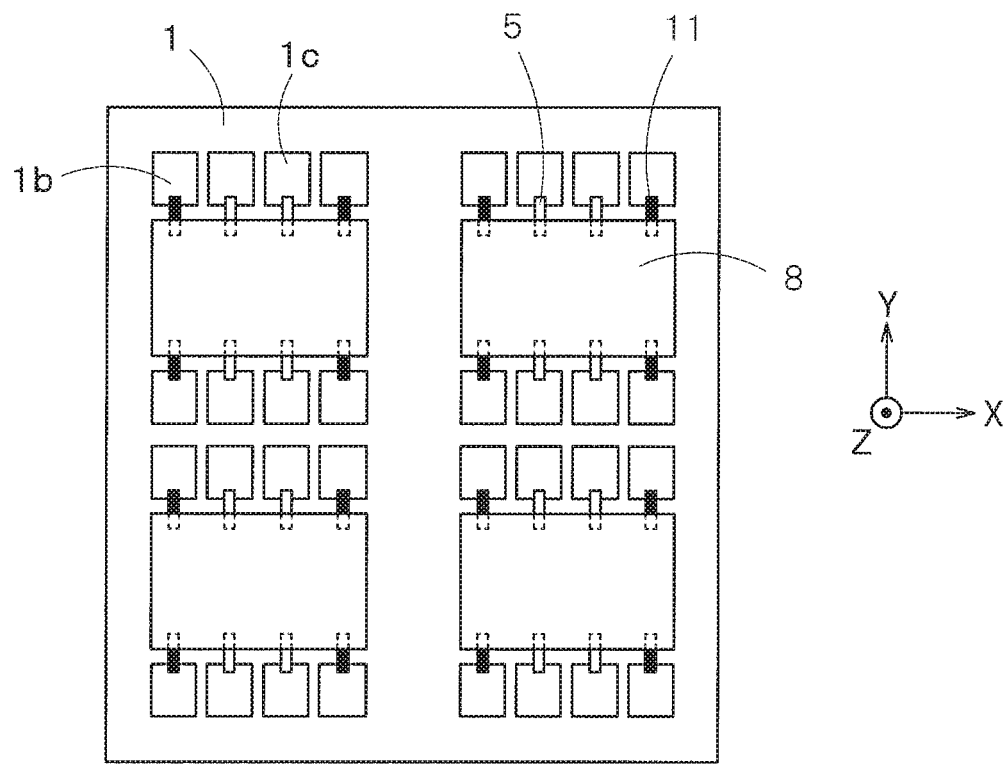
Figure 10A:
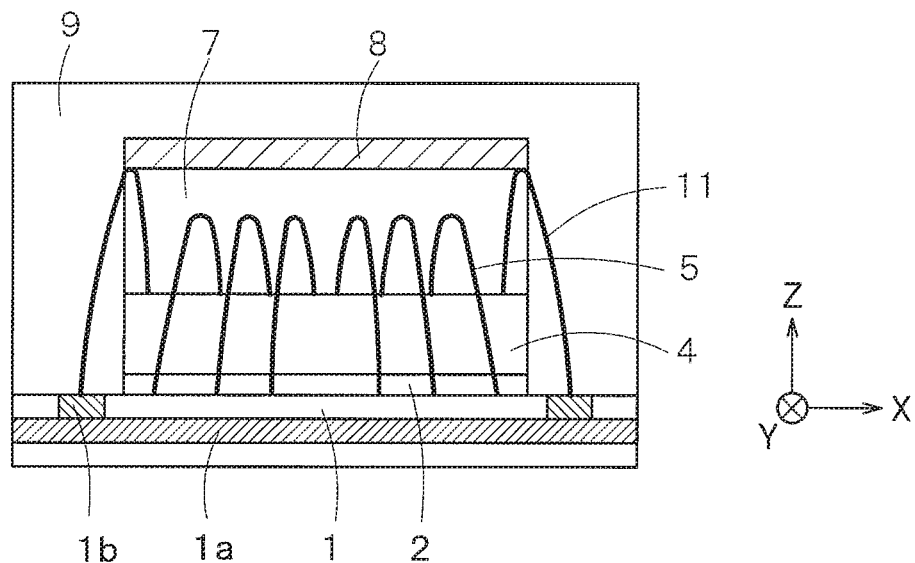
Figure 10B:
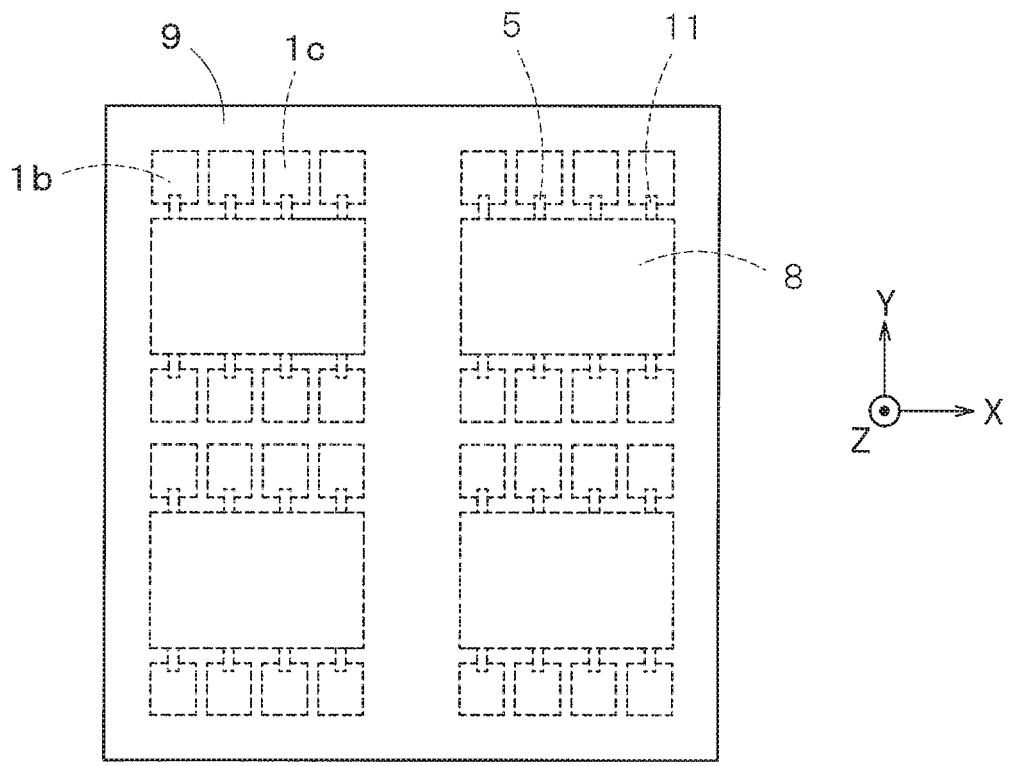

Next, the shield upper plates 8 are mounted above the semiconductor chips 4 via the embedding DA materials 7 (FIGS. 9A and 9B). Furthermore, the shield upper plates 8 are electrically connected to the shielding wires 11 (FIGS. 10A and 10B). More specifically, the shield upper plates 8 are electrically connected to the shielding wires 11 by being brought into contact with the shielding wires 11. Also, the shield upper plates 8 are electrically insulated from the bonding wires 5 by being kept out of contact with the bonding wires 5. The shield upper plates 8 are formed, for example, of a conductive material having high electrical conductivity such as copper or 42 alloy. The shield upper plates 8 are an example of a second shield member.

In the present embodiment, the ground layer 1a is electrically connected to the shield upper plates 8 by the shielding wires 11. Accordingly, the ground layer 1a, the shielding wires 11 and the shield upper plate 8 can effectively protect the semiconductor chips 4 from electromagnetic noise by functioning as a single conductive material.

As illustrated in FIG. 9A, the shield upper plates 8 are mounted above the semiconductor chips 4 via the embedding DA materials 7 pasted on the lower faces of the shield upper plates 8. With this arrangement, as illustrated in FIG. 10A, portions of the bonding wires 5 and the shielding wires 11 are embedded by the embedding DA materials 7, and the positions of the shield upper plates 8 are fixed with respect to the shielding wires 11. After that, the semiconductor chips 4 and the like are sealed by the sealing resin 9 in the present embodiment (FIGS. 10A and 10B).

Figure 11:
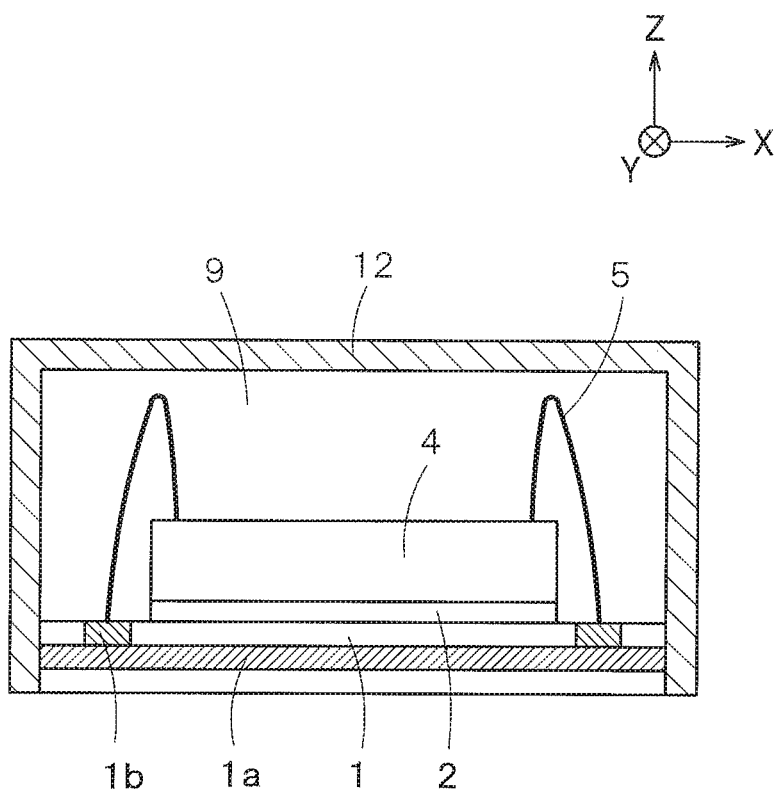
FIG. 11 is a cross-sectional view illustrating a structure of a semiconductor device of a comparative example of the second embodiment.

FIG. 11 is a cross-sectional view illustrating a structure of a semiconductor device of a comparative example of the second embodiment.

The semiconductor device in this comparative example includes a shield layer (plated layer) 12 that coats the sealing resin 9, in place of the shielding wires 11 and the shield upper plates 8. The shield layer 12 is electrically connected to the ground layer 1a. In this situation, there are problems that the semiconductor manufacturing apparatus is contaminated, the shielding effect is lowered when the shield layer 12 comes off, and it is difficult to engrave a laser mark on the shield layer 12. In contrast, the present embodiment makes it possible to solve these problems by avoiding the use of the shield layer 12.

As explained above, the ground layer 1a and the shield upper plates 8 in the present embodiment are electrically connected by the shielding wires 11. Consequently, the present embodiment makes it possible to realize a shield structure by using the ground layer 1a, the shielding wires 11 and the shield upper plates 8, and to prevent electromagnetic noise from being released from the semiconductor chips 4 to the outside and to prevent electromagnetic noise from entering the semiconductor chips 4 from the outside by using the shield structure having a high shielding effect.

Although the shielding wires 11 of the present embodiment have the linear shapes, the shielding wires 11 may have belt-like shapes similarly to the shielding wires 6 of the first embodiment. Conversely, although the shielding wires 6 of the first embodiment have the belt-like shapes, the shielding wires 6 may have linear shapes similarly to the shielding wires 11 of the present embodiment. When a wire having a belt-like shape is connected to a pad, it is possible to connect the wire to the pad through a pressure bonding process, for example. In contrast, when a wire having a linear shape is connected to a pad, it is possible to connect the wire to the pad by implementing a commonly-used wire bonding method, for example.

Third Embodiment

FIGS. 12A to 16B are cross-sectional views and top views illustrating a method of manufacturing a semiconductor device of a third embodiment. For example, the method of the present embodiment is applied to a case where a semiconductor chip need be protected from magnetic noise caused by a static magnetic field.

Figure 12A:
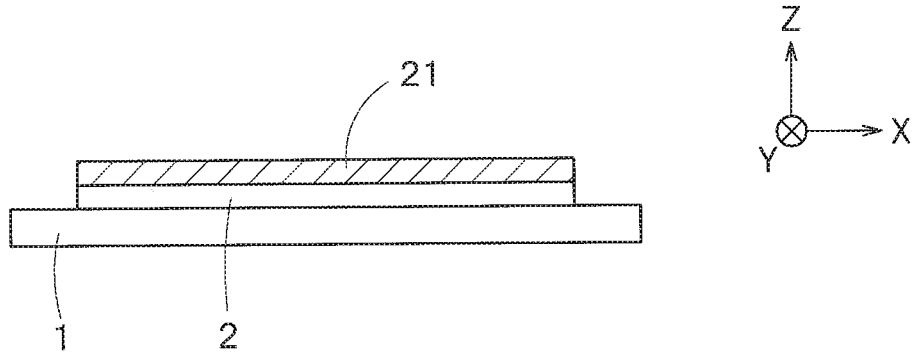
Figure 12B:
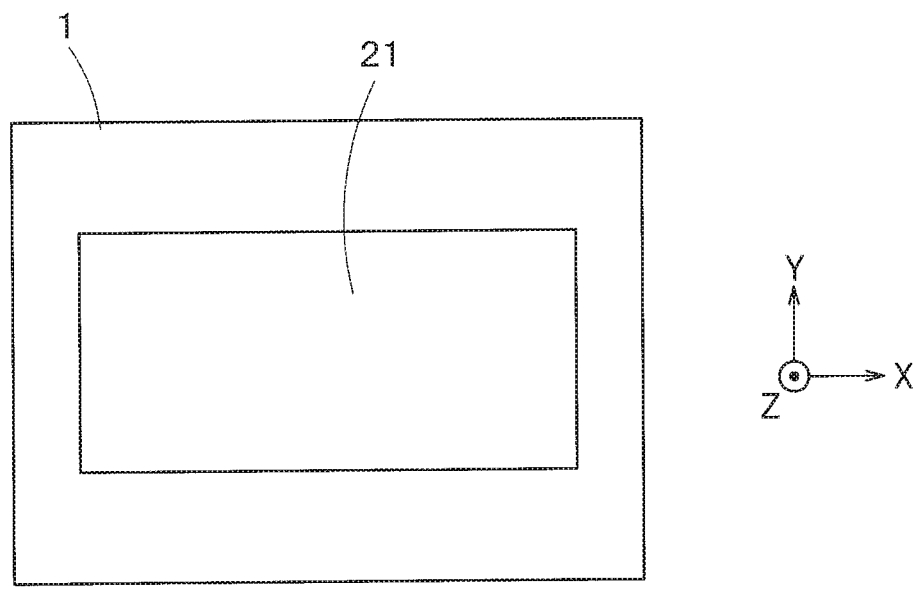

First, a lower shield sheet 21 is mounted on a substrate 1 via a DA material 2 (FIGS. 12A and 12B). The lower shield sheet 21 is, for example, a resin film containing a magnetic material (metallic material) having high magnetic permeability such as iron or permalloy. The lower shield sheet 21 is an example of a first shield member.

Next, a semiconductor chip 4 is mounted on the lower shield sheet 21 via the DA material 2. The substrate 1 is electrically connected to the semiconductor chip 4 by bonding wires 5 (FIGS. 13A and 13B). The bonding wires 5 are an example of the first wire.

Next, an upper shield sheet 22 is mounted above the semiconductor chip 4 via an embedding DA material 7 (FIGS. 14A and 14B). More specifically, the upper shield sheet 22 is electrically and magnetically insulated from the bonding wires 5 as a result of the upper shield sheet 22 being kept out of contact with the bonding wires 5. The upper shield sheet 22 is, for example, a resin film containing a magnetic material (metallic material) having high magnetic permeability such as iron or permalloy. The upper shield sheet 22 is an example of a second shield member.

The upper shield sheet 22 is mounted above the semiconductor chip 4 via the embedding DA material 7 pasted on the lower face of the upper shield sheet 22. With this arrangement, as illustrated in FIG. 14A, portions of the bonding wires 5 are embedded by the embedding DA materials 7, and the position of the upper shield sheet 22 is fixed.

Next, the lower shield sheet 21 is magnetically connected to the upper shield sheet 22 by two connection shield sheets 23 (FIGS. 15A and 15B). These connection shield sheets 23 are disposed so as to sandwich the semiconductor chip 4 and the upper shield sheet 22. More specifically, the bonding wires 5 are electrically connected to the substrate 1 and the semiconductor chip 4 in the vicinity of the first and the second lateral faces $S_1$ and $S_2$. In contrast, the connection shield sheets 23 are magnetically connected to the lower shield sheet 21 and to the upper shield sheet 22 in the vicinity of the third and the fourth lateral faces $S_3$ and $S_4$ (see FIG. 3B and the like for the first to the fourth lateral faces $S_1$ to $S_4$). The connection shield sheets 23 are an example of a connecting member.

As explained above, each bonding wire 5 of the present embodiment is electrically connected to the substrate 1 and the semiconductor chip 4 on the side of the first or second lateral face $S_1$ or $S_2$. Each connection shield sheet 23 of the present embodiment is magnetically connected to the lower shield sheet 21 and the upper shield sheet 22 on the side of the third or fourth lateral face $S_3$ or $S_4$.

Each connection shield sheet 23 is, for example, a resin film containing a magnetic material (metallic material) having high magnetic permeability such as iron or permalloy and has a sheet-like shape. The connection shield sheets 23 of the present embodiment are magnetically connected to the lower shield sheet 21 and to the upper shield sheet 22 through a pressure bonding process without using any adhesive agent. An example of the pressure bonding process is a thermal compression bonding process. The reference numeral "24" indicates connection portions between the lower shield sheet 21 and the connection shield sheets 23 subject to the pressure bonding process, and connection portions between the upper shield sheet 22 and the connection shield sheets 23 subject to the pressure bonding process. Because the connection shield sheets 23 are easily bent, it is possible to easily perform the pressure bonding step with the bending even when there is a height difference between the connection portions 24 of the lower shield sheet 21 and the connection portions 24 of the upper shield sheet 22 as in the present embodiment.

The lower shield sheet 21, the upper shield sheet 22 and the connection shield sheets 23 of the present embodiment are formed of resin that is in a semi-hardened state prior to the connecting process. By hardening the resin of the shield sheets 21 to 23 at the time of the connecting process, it is possible to firmly connect the shield sheets 21 to 23 together.

The lower shield sheet 21 and the upper shield sheet 22 in the present embodiment is magnetically connected by the connection shield sheets 23. Accordingly, the lower shield sheet 21, the upper shield sheet 22 and the connection shield sheets 23 can effectively protect the semiconductor chip 4 from magnetic noise by functioning as a single magnetic material. It is desirable to form the lower shield sheet 21, the upper shield sheet 22 and the connection shield sheets 23 by using one or more types of magnetic materials having the same or similar levels of magnetic permeability. With this arrangement, it is possible to prevent an N pole and an S pole generating a large magnetic field from being generated in the magnetic material made of the lower shield sheet 21, the upper shield sheet 22 and the connection shield sheets 23.

After that, the semiconductor chip 4 and the like are sealed by the sealing resin 9 in the present embodiment (FIGS. 16A and 16B).

As explained above, the lower shield sheet 21 and the upper shield sheet 22 in the present embodiment are magnetically connected by the connection shield sheets 23. Consequently, the present embodiment makes it possible to realize a shield structure by using the lower shield sheet 21, the upper shield sheet 22 and the connection shield sheets 23, which can protect the semiconductor chip 4 from magnetic noise by using the shield structure having a high shielding effect. Also, the present embodiment makes it possible, by avoiding the use of the adhesive agent 10, to avoid the material cost of the adhesive agent 10 and burdens from the adhering step, which can shorten the TAT in the manufacture of the semiconductor device.

Furthermore, the size (the area) of the lower shield sheet 21 and the size (the area) of the upper shield sheet 22 are arranged to be larger than the area of the top face of the semiconductor chip 4 in the present embodiment (see FIGS. 13B and 15B). Consequently, the present embodiment makes it possible to avoid the situation where an edge of the lower shield sheet 21 or an edge of the upper shield sheet 22 comes into contact with the semiconductor chip 4. However, it is also acceptable to arrange the size of the upper shield sheet 22 to be smaller than the area of the top face of the semiconductor chip 4.

Furthermore, the length of the lower shield sheet 21 in the X-direction and the length of the upper shield sheet 22 in the X-direction are arranged to be longer than the length of the semiconductor chip 4 in the X-direction in the present embodiment (see FIGS. 13B and 15B). Consequently, the present embodiment makes it possible to avoid the situation where the connection shield sheets 23 connected to the lower shield sheet 21 and to the upper shield sheet 22 come into contact with the bonding wires 5.

Fourth Embodiment

FIGS. 17A to 21B are cross-sectional views and top views illustrating a method of manufacturing a semiconductor device of a fourth embodiment. For example, the method of the present embodiment is applied to a case where a semiconductor chip generates an electromagnetic wave or may be influenced by an electromagnetic wave.

First, the lower shield sheet 21 is mounted on the substrate 1 via a DA material 2 (FIGS. 17A and 17B). It is noted that the lower shield sheet 21 has openings 31 for a wire bonding explained later. The lower shield sheet 21 is, for example, a resin film containing a conductive material (metallic material) having high electrical conductivity such as copper or 42 alloy. The lower shield sheet 21 is an example of a first shield member.

Next, the semiconductor chip 4 is mounted on the lower shield sheet 21 via a DA material 2. The substrate 1 is electrically connected to the semiconductor chip 4 via the bonding wires 5 (FIGS. 18A and 18B). In this situation, the bonding wires 5 are connected to the surface of the substrate 1 exposed in the openings 31. The bonding wires 5 are an example of the first wire.

Next, the upper shield sheet 22 is mounted above the semiconductor chip 4 via the embedding DA material 7 (FIGS. 19A and 19B). More specifically, the upper shield sheet 22 is electrically insulated from the bonding wires 5 as a result of the upper shield sheet 22 being kept out of contact with the bonding wires 5. The upper shield sheet 22 is, for example, a resin film containing a conductive material (metallic material) having high electrical conductivity such as copper or 42 alloy. The upper shield sheet 22 is an example of a second shield member.

Next, the lower shield sheet 21 is electrically connected to the upper shield sheet 22 by four connection shield sheets 23 (FIGS. 20A and 20B). These connection shield sheets 23 are disposed so that two of the connection shield sheets 23 sandwich the semiconductor chip 4 and the upper shield sheet 22 from the ±X directions and so that the other two connection shield sheets 23 sandwich the semiconductor chip 4 and the upper shield sheet 22 from the ±Y directions. More specifically, the bonding wires 5 are electrically connected to the substrate 1 and to the semiconductor chip 4 in the vicinity of the third and the fourth lateral faces $S_3$ and $S_4$. In contrast, the connection shield sheets 23 are electrically connected to the lower shield sheet 21 and to the upper shield sheet 22 in the vicinity of the first to the fourth lateral faces $S_1$ to $S_4$ (see FIG. 8B and the like for the first to the fourth lateral faces $S_1$ to $S_4$). The connection shield sheets 23 are an example of the connecting member.

As explained above, each bonding wire 5 of the present embodiment is electrically connected to the substrate 1 and the semiconductor chip 4 on the side of the third or fourth lateral face $S_3$ or $S_4$. Each connection shield sheet 23 of the present embodiment is electrically connected to the lower shield sheet 21 and to the upper shield sheet 22 on the side of one of the first to fourth lateral faces $S_1$ to $S_4$.

Each connection shield sheet 23 is, for example, a resin film containing a conductive material (metallic material) having high electrical conductivity such as copper or 42 alloy, and has a sheet-like shape. Similarly to those in the third embodiment, the connection shield sheets 23 of the present embodiment are electrically connected to the lower shield sheet 21 and to the upper shield sheet 22 through a pressure bonding process without using any adhesive agent. The reference numeral "24" indicates connection portions between the lower shield sheet 21 and the connection shield sheets 23 subject to the pressure bonding process, and connection portions between the upper shield sheet 22 and the connection shield sheets 23 subject to the pressure bonding process.

After that, the semiconductor chip 4 and the like are sealed by the sealing resin 9 in the present embodiment (FIGS. 21A and 21B).

As explained above, the lower shield sheet 21 and the upper shield sheet 22 in the present embodiment are electrically connected by the connection shield sheets 23. Consequently, the present embodiment makes it possible to realize a shield structure by using the lower shield sheet 21, the upper shield sheet 22 and the connection shield sheets 23, which can prevent electromagnetic noise from being released from the semiconductor chip 4 to the outside and prevent electromagnetic noise from entering the semiconductor chip 4 from the outside by using the shield structure having a high shielding effect.

Furthermore, the present embodiment makes it possible, by avoiding the use of the shield layer 12 described above, to avoid the situations that the semiconductor manufacturing apparatus is contaminated, the shielding effect is lowered when the shield layer 12 comes off, and it is difficult to engrave a laser mark on the shield layer 12. According to the present embodiment, it is possible to form the shield structure on the inside of a semiconductor package.

Furthermore, in the present embodiment, the bottom and top faces of the semiconductor chip 4 are shielded by the lower shield sheet 21 and the upper shield sheet 22, and the four lateral faces $S_1$ to $S_4$ of the semiconductor chip 4 are shielded by the four connection shield sheets 23. Consequently, the present embodiment makes it possible to shield all the six faces of the semiconductor chip 4 with the shield structure, and to realize a shield structure having an even higher shielding effect.

Alternatively, the semiconductor chip 4 in the present embodiment may be shielded by two connection shield sheets 23 in the same manner as in the third embodiment. Conversely, the semiconductor chip 4 in the third embodiment may be shielded by four connection shield sheets 23 in the same manner as in the present embodiment.

Fifth Embodiment

FIGS. 22A and 22B are a cross-sectional view and a top view illustrating a structure of a semiconductor device of a fifth embodiment. For example, the method of the present embodiment is applied to a case where a semiconductor chip need be protected from magnetic noise caused by a static magnetic field.

The semiconductor device of the present embodiment has a structure in which the semiconductor device of the first embodiment further includes the lower shield sheet 21, the upper shield sheet 22 and the connection shield sheets 23 of the third embodiment. It is noted that the upper shield sheet 22 of the present embodiment is mounted on the shield upper plate 8 via a DA material 2, instead of being mounted on the semiconductor chip 4 via the embedding DA material 7 (see FIG. 16A). The shield lower plate 3, the shield upper plate 8, the lower shield sheet 21 and the upper shield sheet 22 are examples of the first, second, third and fourth shield members, respectively.

The semiconductor device of the present embodiment is manufactured, for example, by performing the step illustrated in FIGS. 12A and 12B, subsequently performing the steps illustrated in FIGS. 1A to 4B, and then performing the steps illustrated in FIGS. 14A to 16B. It is noted that, at the step illustrated in FIG. 1A to 1B, the shield lower plate 3 is mounted on the lower shield sheet 21 via the DA material 2. Furthermore, at the step illustrated in FIGS. 14A and 14B, the upper shield sheet 22 is mounted on the shield upper plate 8 via the DA material 2.

From another point of view, the semiconductor device of the present embodiment has a structure in which the semiconductor device of the third embodiment further includes the shield lower plate 3, the shielding wire 6 and the shield upper plate 8 of the first embodiment. In this situation, the lower shield sheet 21, the upper shield sheet 22, the shield lower plate 3 and the shield upper plate 8 are examples of the first, second, third and fourth shield members, respectively. It is possible to manufacture the semiconductor device in this example also, by performing the step illustrated in FIGS. 12A and 12B, subsequently performing the steps illustrated in FIGS. 1A to 4B, and then performing the steps illustrated in FIGS. 14A to 16B.

The present embodiment makes it possible to realize a shield structure by using the shield lower plate 3, the shielding wire 6, the shield upper plate 8, the lower shield sheet 21, the upper shield sheet 22 and the connection shield sheets 23, which can protect the semiconductor chip 4 from magnetic noise by using the shield structure having a high shielding effect.

Sixth Embodiment

FIGS. 23A and 23B are a cross-sectional view and a top view illustrating a structure of a semiconductor device of a sixth embodiment. For example, the method of the present embodiment is applied to a case where a semiconductor chip generates an electromagnetic wave or may be influenced by an electromagnetic wave.

The semiconductor device of the present embodiment has a structure in which the semiconductor device of the second embodiment further includes the lower shield sheet 21, the upper shield sheet 22 and the connection shield sheets 23 of the fourth embodiment. It is noted that the upper shield sheet 22 of the present embodiment is mounted on the shield upper plate 8 via a DA material 2, instead of being mounted on the semiconductor chip 4 via the embedding DA material 7 (see FIG. 19A). The ground layer 1a, the shield upper plate 8, the lower shield sheet 21 and the upper shield sheet 22 are examples of the first, second, third and fourth shield members, respectively.

The semiconductor device of the present embodiment is manufactured, for example, by performing the step illustrated in FIGS. 7A and 7B, subsequently performing the step illustrated in FIGS. 17A and 17B and performing by the steps illustrated in FIGS. 8A to 9B, and then performing the steps illustrated in FIGS. 19A to 21B. It is noted that, at the step illustrated in FIGS. 17A and 17B, the lower shield sheet 21 is formed on the substrate 1 including the ground layer 1a via a DA material 2, and the openings 31 are not needed. Furthermore, at the steps illustrated in FIGS. 8A and 8B, the semiconductor chip 4 is mounted on the lower shield sheet 21 via a DA material 2. In addition, at the step illustrated in FIGS. 19A and 19B, the upper shield sheet 22 is mounted on the shield upper plate 8 via a DA material 2.

From another point of view, the semiconductor device of the present embodiment has a structure in which the semiconductor device of the fourth embodiment further includes the ground layer 1a, the pads 1b and 1c, the shielding wire 6 and the shield upper plate 8 of the second embodiment. In that situation, the lower shield sheet 21, the upper shield sheet 22, the ground layer 1a and the shield upper plate 8 are examples of the first, second, third and fourth shield members, respectively. The semiconductor device in this example is also manufactured by performing the step illustrated in FIGS. 7A and 7B, subsequently performing the step illustrated in FIGS. 17A and 17B and performing the steps illustrated in FIGS. 8A to 9B, and then performing the steps illustrated in FIGS. 19A to 21B.

The present embodiment makes it possible to realize a shield structure by using the ground layer 1a, the shielding wire 6, the shield upper plate 8, the lower shield sheet 21, the upper shield sheet 22 and the connection shield sheets 23, which can prevent electromagnetic noise from being released from the semiconductor chip 4 to the outside and prevent electromagnetic noise from entering the semiconductor chip 4 from the outside by using the shield structure having a high shielding effect.

Modifications of the fifth and sixth embodiments include a semiconductor device having a structure obtained by combining the structures of the semiconductor devices of the first embodiment and the fourth embodiment, and a semiconductor device having a structure obtained by combining the structures of the semiconductor devices of the second embodiment and the third embodiment. By using any of these modifications, it is possible to realize a semiconductor device capable of addressing both magnetic field noise and electromagnetic noise.

While certain embodiments have been described, these embodiments have been presented by way of example only, and are not intended to limit the scope of the inventions. Indeed, the novel devices and methods described herein may be embodied in a variety of other forms; furthermore, various omissions, substitutions and changes in the form of the devices and methods described herein may be made without departing from the spirit of the inventions. The accompanying claims and their equivalents are intended to cover such forms or modifications as would fall within the scope and spirit of the inventions.

The invention claimed is:

1. A semiconductor device comprising:
   a substrate;
   a first shield member provided on an upper face of the substrate;
   a semiconductor chip provided on the first shield member;
   a first wire electrically connected to the semiconductor chip and the substrate;
   a second shield member provided above the semiconductor chip and electrically insulated from the first wire; and
   a connecting member electrically or magnetically connected to the first shield member and the second shield member through a pressure bonding process, and having a sheet-like shape, the connecting member being bonded to the first and second shield members without any adhesive.

2. The device of claim 1, wherein each of the first shield member, the second shield member, and the connecting member is a resin film containing a magnetic material or a conductive material.

3. The device of claim 1, further comprising, as the connecting member, first and second connecting members provided so as to sandwich the semiconductor chip and the second shield member.

4. The device of claim 1, wherein:
   the semiconductor chip comprises a first lateral face, a second lateral face positioned opposite the first lateral face, a third lateral face positioned between the first lateral face and the second lateral face, and a fourth lateral face positioned opposite the third lateral face, and the first wire is electrically connected to the semiconductor chip and the substrate on a side of the first or second lateral face, and the connecting member is electrically or magnetically connected to the first and the second shield members on a side of the third or fourth lateral face.

5. The device of claim 1, wherein:
the semiconductor chip comprises a first lateral face, a second lateral face positioned opposite the first lateral face, a third lateral face positioned between the first lateral face and the second lateral face, and a fourth lateral face positioned opposite the third lateral face, and
the first wire is electrically connected to the semiconductor chip and the substrate on a side of the third or fourth lateral face, and the connecting member is electrically or magnetically connected to the first and the second shield members on a side of the third or fourth lateral face.

6. The device of claim 1, further comprising:
a third shield member provided below the semiconductor chip;
a second wire electrically or magnetically connected to the third shield member; and
a fourth shield member provided between the semiconductor chip and the second shield member, electrically insulated from the first wire, and electrically or magnetically connected to the second wire.

7. The device of claim 1, wherein the second shield member is provided above the semiconductor chip via a film, and a portion of the first wire is provided in the film.

8. A method of manufacturing a semiconductor device, the method comprising:
mounting a semiconductor chip on a first shield member provided on an upper face of a substrate;
electrically connecting a first wire to the semiconductor chip and the substrate;
mounting a second shield member above the semiconductor chip so as to be electrically insulated from the first wire; and
electrically or magnetically connecting the first shield member to the second shield member by using a connecting member having a sheet-like shape,
wherein the connecting member is electrically or magnetically connected to the first and second shield members through a pressure bonding process.

9. The method of claim 8, further comprising providing, as the connecting member, first and second connecting members so as to sandwich the semiconductor chip and the second shield member.

10. The method of claim 8, wherein the second shield member is mounted above the semiconductor chip via a film formed on the second shield member.

11. The method of claim 10, wherein the second shield member is mounted above the semiconductor chip such that a portion of the first wire is embedded by the film.

12. The method of claim 8, further comprising:
electrically or magnetically connecting a second wire to a third shield member positioned below the semiconductor chip; and
mounting a fourth shield member above the semiconductor chip so as to be electrically insulated from the first wire and to be electrically or magnetically connected to the second wire,
wherein the second shield member is mounted on the fourth shield member.

13. The method of claim 12, wherein the fourth shield member is mounted above the semiconductor chip via a film formed on the fourth shield member.

14. The method of claim 13, wherein the fourth shield member is mounted above the semiconductor chip such that portions of the first and the second wires are embedded by the film.

15. The method of claim 8, wherein the connecting member is formed on an upper face of the first shield member and an upper face of the second shield member.

16. A semiconductor device comprising:
a substrate;
a first shield member provided on an upper face of the substrate;
a semiconductor chip provided on the first shield member;
a first wire electrically connected to the semiconductor chip and the substrate;
a second shield member provided above the semiconductor chip and electrically insulated from the first wire; and
a connecting member electrically or magnetically connected to the first shield member and the second shield member and having a sheet-like shape,
wherein the connecting member is provided on an upper face of the first shield member and an upper face of the second shield member.

17. A semiconductor device comprising:
a substrate;
a first shield member provided on an upper face of the substrate;
a semiconductor chip provided on the first shield member;
a first wire electrically connected to the semiconductor chip and the substrate;
a second shield member provided above the semiconductor chip and electrically insulated from the first wire; and
a connecting member electrically or magnetically connected to the first shield member and the second shield member and having a sheet-like shape,
wherein the semiconductor device comprises, as the connecting member, first and second connecting members provided so as to sandwich the semiconductor chip and the second shield member.

* * * * *